(12) United States Patent
Fujimori et al.

(10) Patent No.: US 7,213,925 B2
(45) Date of Patent: May 8, 2007

(54) OPTICAL MODULATOR, OPTICAL DEVICE AND PROJECTOR

(75) Inventors: Motoyuki Fujimori, Suwa (JP); Masami Murata, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 296 days.

(21) Appl. No.: 11/053,855

(22) Filed: Feb. 10, 2005

(65) Prior Publication Data

US 2005/0185146 A1   Aug. 25, 2005

(30) Foreign Application Priority Data

Feb. 16, 2004   (JP) ............... 2004-038332

(51) Int. Cl.
  *G03B 21/16* (2006.01)
  *B21F 1/1335* (2006.01)
(52) U.S. Cl. ............................. 353/52; 349/5
(58) Field of Classification Search .......... 353/52, 353/54, 61, 121; 349/1, 5, 56, 149, 150, 349/161
See application file for complete search history.

(56) References Cited

U.S. PATENT DOCUMENTS

| | | |
|---|---|---|
| 4,716,259 A | 12/1987 | Tokura et al. |
| 4,901,193 A | 2/1990 | Kinugawa et al. |
| 5,170,195 A | 12/1992 | Akiyama et al. |
| 6,224,395 B1 | 5/2001 | Dahlen et al. |
| 2003/0098944 A1 | 5/2003 | Numata et al. |

FOREIGN PATENT DOCUMENTS

| | | |
|---|---|---|
| EP | 1 389 019 A2 | 2/2004 |
| GB | 2 382 932 A | 6/2003 |
| JP | A-01-159684 | 6/1989 |
| JP | A-2003-233441 | 8/2003 |
| WO | WO 98/43227 A1 | 10/1998 |

*Primary Examiner*—Rodney Fuller
(74) *Attorney, Agent, or Firm*—Oliff & Berridge, PLC

(57) ABSTRACT

A liquid crystal panel (441) as an optical modulator includes: a driving board (441C) having a plurality of signal lines, a plurality of switching elements connected to the signal lines and a plurality of picture electrodes connected to the switching elements; an opposing board (441D) being opposed to the driving board (441C) and having common electrodes; and a flexible printed board (441E) electrically connected with the plurality of signal lines and the common electrodes, the flexible printed board extended from between the driving board (441C) and the opposing board (441D). The flexible printed board (441E) is provided with an insertion hole (441E1) for a fluid circulator in which a cooling fluid is circulated to be inserted.

13 Claims, 19 Drawing Sheets

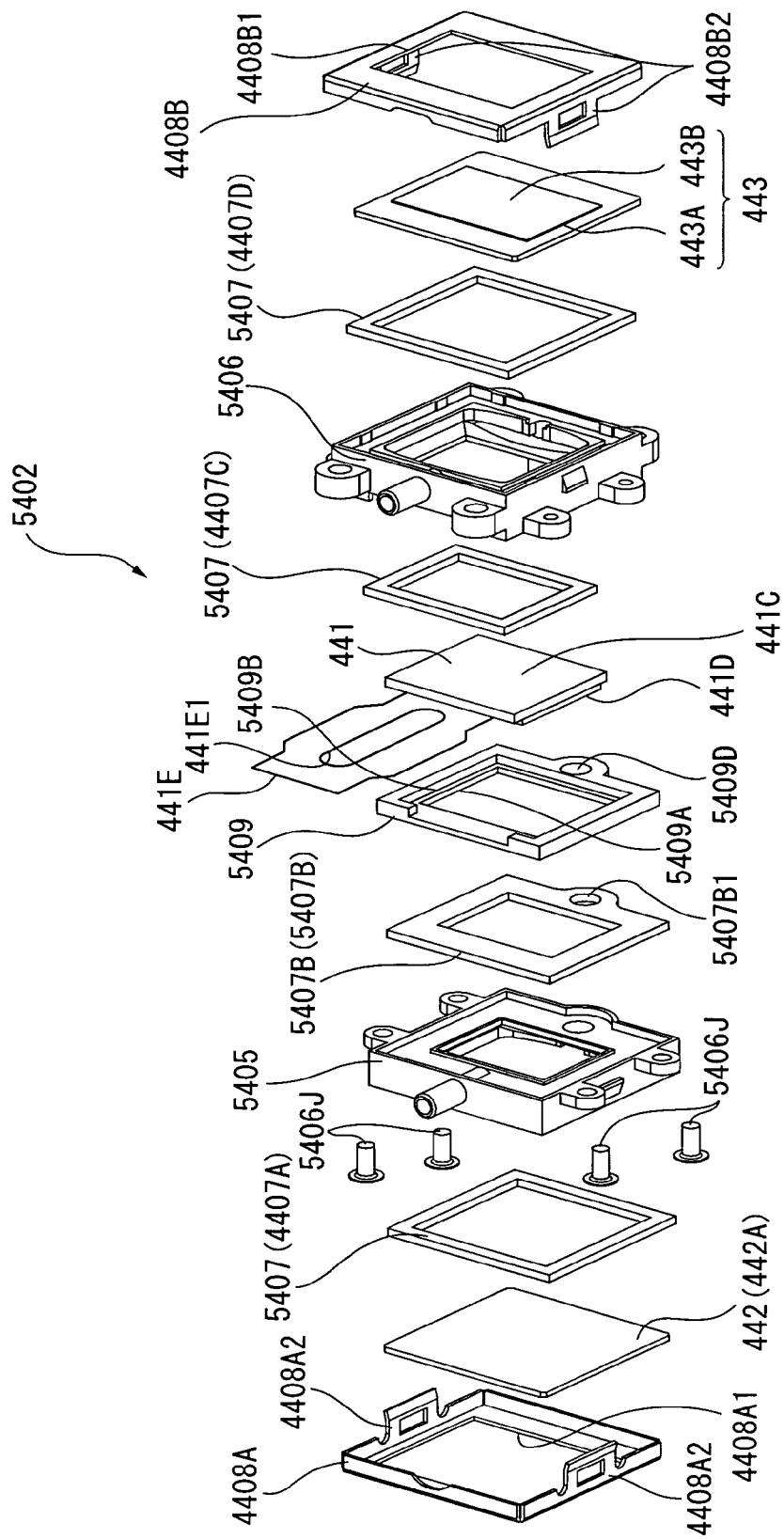

OPTICAL MODULATOR, OPTICAL DEVICE AND PROJECTOR

BACKGROUND OF THE INVENTION

1. Field of the Invention

The present invention relates to an optical modulator, an optical device and a projector.

2. Description of Related Art

Conventionally, there has been known a projector having a plurality of optical modulating devices that modulate a light beam irradiated from a light source in accordance with image information to form an optical image, a color-combining optical device that combines and irradiates the light beam modulated by the optical modulating device, and a projection optical device that projects the light beam combined by the color-combining optical device in an enlarged manner.

As an optical modulating device in such projector, for instance, an active matrix driven optical modulator has been widely used. Specifically, the optical modulator includes: a pair of boars including a driving board disposed on a light-irradiation side, the driving board having a data line, a scan line, a switching element, a picture electrode, etc. for applying drive voltage to a liquid crystal, and an opposing board disposed on a light-irradiation side, the opposing board having a common electrode, a black mask, etc.; a liquid crystal layer including electrooptic materials such as liquid crystal sealed between the pair of boards; and a flexible printed board extending from between the pair of boards to output predetermined drive signals to the scan line, the data line, the common electrode, and the like.

At the light-incident side and the light-irradiation side of the optical modulator, an incident-side polarization plate and an irradiation-side polarization plate transmitting a light beam with a predetermined polarization axis are respectively disposed.

When the light beam irradiated from the light source is irradiated on the optical modulator, the optical modulator tends to be subjected to the temperature rise due to light absorption of the data line and the scan line formed on the driving board and the black matrix formed on the opposing boards as well as light absorption of the liquid crystal layer. Further, out of the light beams emitted from the light source and transmitted through the optical modulator, the light beam not having the predetermined optical axis is absorbed by the incident-side polarization plate and irradiation-side polarization plate, which easily causes generation of heat on the polarization plates.

Therefore, for projectors having such optical elements therein, an arrangement having a cooling device using a cooling fluid has been proposed for restraining temperature rise of the optical elements (see, for example, Reference: JP Hei 1-159684A).

The cooling device disclosed in JP Hei 1-159684A includes a cooling chamber supporting the optical modulator and a polarization plate at the light source side in a spaced manner and having the cooling fluid filled therein. The cooling chamber is intercommunicated with a radiator and a fluid pump through a tube or the like capable of delivering the cooling fluid through the inside thereof. Thus, the internal cooling fluid circulates in a flow path from the cooling chamber to the radiator, the fluid pump, and back to the cooling chamber through the tube. With such arrangement, the heat generated on the optical modulator and the incident-side polarization plate due to the light beam emitted from the light source is released to the cooling fluid.

In the cooling device disclosed in JP Hei 1-159684A, for instance, when the tube or the like is intercommunicated with an end in the direction as the extension direction of the flexible printed board of the optical modulator in the cooling chamber, the tube needs to be installed so as not to interfere with the flexible printed board, in other words, to avoid contact with the flexible printed board to connect the radiator, the fluid pump, and the like.

Therefore, in such case, a troublesome work is necessary in installation of the tube or the like.

SUMMARY OF THE INVENTION

An object of the present invention is to provide an optical modulator, an optical device, and a projector that allow easy operation in installing a fluid circulator.

An optical modulator according to an aspect of the present invention that modulates a light beam irradiated from a light source in accordance with image information to form an optical image includes: a driving board having a plurality of signal lines, a plurality of switching elements connected to the plurality of signal lines and a plurality of picture electrodes connected to the plurality of switching elements; an opposing board being opposed to the driving board and having common electrodes; a liquid crystal sealed between the driving board and the opposing board; and a circuit board electrically connected to the plurality of signal lines and the common electrodes and extending from between the driving board and the opposing board, the circuit board being provided with an insertion hole for a fluid circulator in which a cooling fluid is circulated to be inserted.

The optical modulator of the present invention may be, for instance, a transmissive type or a reflection type having a reflection layer, or an arrangement having both transmissive and reflection types.

According to the present invention, since the insertion hole is formed on the circuit board constituting the optical modulator, the following arrangement can be realized.

The optical modulator of the present invention is incorporated in an optical device capable of cooling the optical modulator by the cooling fluid sealed in the cooling chamber. At this time, the fluid circulator constituting the optical device intercommunicated to the cooling chamber to circulate the cooling fluid is inserted into the insertion hole of the circuit board of the optical modulator.

In such arrangement, even when the cooling chamber is intercommunicated to the fluid circulator at an end in a direction identical with the extending direction of the circuit board, the fluid circulator does not have to be installed to avoid contact with the circuit board. Thus, when the optical modulator of the present invention is incorporated in the optical device, the fluid circulator can be installed easily, which satisfies an object of the present invention.

An optical device according to another aspect of the present invention includes: the above-described optical modulator; an optical modulator holder that has a cooling chamber in which the cooling fluid is sealed therein, the optical modulator holder holding the optical modulator so that heat can be transferred to the cooling fluid in the cooling chamber; and the fluid circulator including a plurality of fluid circulators, the plurality of fluid circulators intercommunicated and connected to the cooling chamber of the optical modulator holder to guide the cooling fluid to the outside of the cooling chamber and to re-introduce the cooling fluid into the cooling chamber, in which the optical modulator holder having an inflow port for introducing the cooling fluid from the outside into the cooling chamber and/or an outflow port for discharging the cooling fluid in the cooling chamber to the outside, the inflow port and/or the outflow port being formed at a side corresponding to a position of the circuit board when the optical modulator is held; and the fluid circulator connected to the inflow port and/or the outflow port out of the plurality of fluid circulators is inserted into the insertion hole of the circuit board.

According to the above arrangement, since the optical device includes the above-described optical modulator, the optical modulator holder and the plurality of fluid circulators, the same functions and advantages as the above-described optical modulator can be obtained.

Since the fluid circulator does not have to be installed to avoid contact with the circuit board, position shift of the optical modulator holder due to reaction force of the fluid circulator does not occur. Therefore, a position of the optical modulator can be properly maintained, so that the optical modulator can be located at an appropriate position relative to an optical axis of the light beam irradiated from the light source.

In the above-described optical device, it is preferable that the optical modulator holder includes a pair of frame members that respectively have an opening in accordance with an image formation area of the optical modulator and sandwich the optical modulator, and transmissive boards that are respectively disposed on sides opposite to opposing sides of the pair of frame members; the cooling chambers are respectively formed in both of the pair of frame members by respectively closing the opposing sides and the sides opposite to the opposing sides of the opening of the pair of frame members with the optical modulator and the transmissive board; and one of the inflow port and the outflow port is formed respectively on first side of the pair of frame members corresponding to a position of the circuit board when the optical modulator is held, and the other one of the inflow port and the outflow port is formed respectively on an opposing second side of the first side.

The inflow port and outflow port to form may be positioned as follows.

For instance, the inflow ports are respectively formed at respective sides corresponding to a position of the circuit board, and the outflow ports are respectively formed at respective sides opposing the respective sides corresponding to the position of the circuit board on the pair of frame members.

On the other hand, the outflow ports are respectively formed at respective sides corresponding to a position of the circuit board, and the inflow ports are respectively formed at respective sides opposing the respective sides corresponding to the position of the circuit board on the pair of frame members.

According to the present invention, the pair of frame members constituting the optical modulator holder are respectively disposed on the light-incident side and the light-irradiation side of the optical modulator. In the pair of frame members, the respective inflow ports and outflow ports are formed to sandwich the circuit board of the optical modulator. For instance, by inserting the fluid circulator connected to the inflow port formed on the light-irradiation side out of the respective inflow ports or the one connected to the outflow port formed on the light-irradiation side out of the respective outflow ports, the fluid circulator can be easily installed in a direction of the light-irradiation side relative to the optical modulator holder without avoiding contact with the circuit board. The above also applies in the same manner when the fluid circulator is installed in a direction of the light-incident side relative to the optical modulator holder.

At this time, an end of each of the fluid circulators being connected to each of the inflow ports or each of the outflow ports may be connected, and the fluid circulator can be installed even more easily by connecting the end of each of the fluid circulators.

In the above-described optical device of to the present invention, it is preferable that: the optical modulator holder includes a pair of frame members that respectively have an opening in accordance with an image formation area of the optical modulator and sandwich the optical modulator, and transmissive boards that are respectively disposed on opposite side to opposing sides of the pair of frame members; the cooling chambers are respectively formed in both of the pair of frame members by respectively closing the opposing sides and the sides opposite to the opposing sides of the opening of the pair of frame members with the optical modulator and the transmissive board; the pair of frame members are provided with a communication hole intercommunicating the respective cooling chambers; the inflow port is formed on a side corresponding to the position of the circuit board when the optical modulator is held in one frame member of the pair of frame members; and the outflow port is formed on a side corresponding to the position of the circuit board when the optical modulator is held in the other frame member of the pair of frame members.

According to the aspect of the present invention, the pair of frame members constituting the optical modulator holder are respectively disposed on the light-incident side and the light-irradiation side of the optical modulator. The inflow ports and the outflow ports are formed on the pair of frame members to sandwich the circuit board of the optical modulator. For example, by inserting the fluid circulator being connected to either of the inflow port or the outflow port into the insertion hole of the circuit board, the fluid circulator can be easily installed in a direction toward either of the inflow port or the outflow port (i.e. either of the light-incident side or the light-irradiation side) without necessity of avoiding contact with the circuit board.

Since the inflow port and the outflow port are respectively formed on the respective sides of the frame members corresponding to the position of the circuit board, connecting operation of the fluid circulator to the optical modulator holder can be performed in a single direction, so that connecting operation of the fluid circulator can be performed easily.

Further, by forming the communication hole in the pair of frame members, two inflow ports and outflow ports do not have to be respectively provided to the respective cooling chambers, and an arrangement of a optical modulator holder having only one inflow port and outflow port may be employed. Therefore, by minimizing the number of the inflow port and the outflow port, connecting operation to the inflow port and the outflow port can be performed even more easily.

Preferably, the above-described optical device includes: the optical modulator having a plurality of optical modulator; the optical modulator holder having a plurality of optical modulator holder in accordance with the plurality of optical modulators; a color-combining optical device having a plurality of light-incident sides to which the plurality of optical modulator holders, the color-combining optical device attached and combining a light beam modulated by the plurality of optical modulators; and a cooling fluid relaying section that is disposed on a side in an extending direction of the circuit board out of the sides orthogonal to the plurality of light-incident sides and is intercommunicated with the respective fluid circulators being connected to the respective inflow ports or the respective outflow ports of the plurality of optical modulator holders and respectively inserted into the insertion hole of the circuit board to collectively relay the cooling fluid circulating in the respective fluid circulators.

In the above, the relaying section collectively relays the cooling fluid, which means that the relaying section branches the cooling fluid from the outside in accordance with the respective optical modulator holders to introduce into the respective cooling chambers of the plurality of optical modulator holders through the respective fluid circulators and the respective inflow ports when the respective fluid circulators being connected to the respective inflow ports of the plurality of optical modulator holders and the relaying section are intercommunicated. When the respective fluid circulators being connected to the respective outflow ports in the plurality of optical modulator holders and the relaying section are intercommunicated, the relaying section collectively introduces the cooling fluid in the respective cooling chambers of the plurality of optical modulator holders through the respective outflow ports and the respective fluid circulators to send out to the outside of the optical device.

In the present invention, since the optical device includes the relaying section, the respective fluid circulators being connected to the respective inflow ports and outflow ports of the plurality of optical modulator holders can be collectively relayed. Therefore, even when a plurality of optical modulators provided, the fluid circulator can be installed easily.

The relaying section is disposed on a side in the extending direction of the circuit board out of the sides orthogonal to the plurality of light-incident sides in the color-combining optical device, so that the size of the optical device does not increase even if a plurality of optical modulators are provided. Therefore, usability of the optical device can be improved.

A projector according to still another aspect of the present invention includes: a light source device, the above-described optical device; and a projection optical device projecting an optical image formed by the optical device in an enlarged manner.

According to the above arrangement, since the projector includes the light source device, the above-described optical device and the projection optical device, the same functions and advantages as the above-described optical modulator can be obtained.

Since the projector includes the optical device capable of properly maintaining the position of the optical modulator, position shift of the optical modulator relative to the optical axis of the light beam irradiated from the light source device does not occur, which prevents unnecessary light from being projected on a screen.

BRIEF DESCRIPTION OF THE DRAWINGS

FIG. 15 is an exploded perspective view showing the outline of an optical modulator holder of the aforesaid exemplary embodiment;

DETAILED DESCRIPTION OF PREFERRED EMBODIMENT(S)

[First Exemplary Embodiment]

A first exemplary embodiment of the present invention will be described below with reference to the attached drawings.

[Arrangement of Projector]

Figure 1:
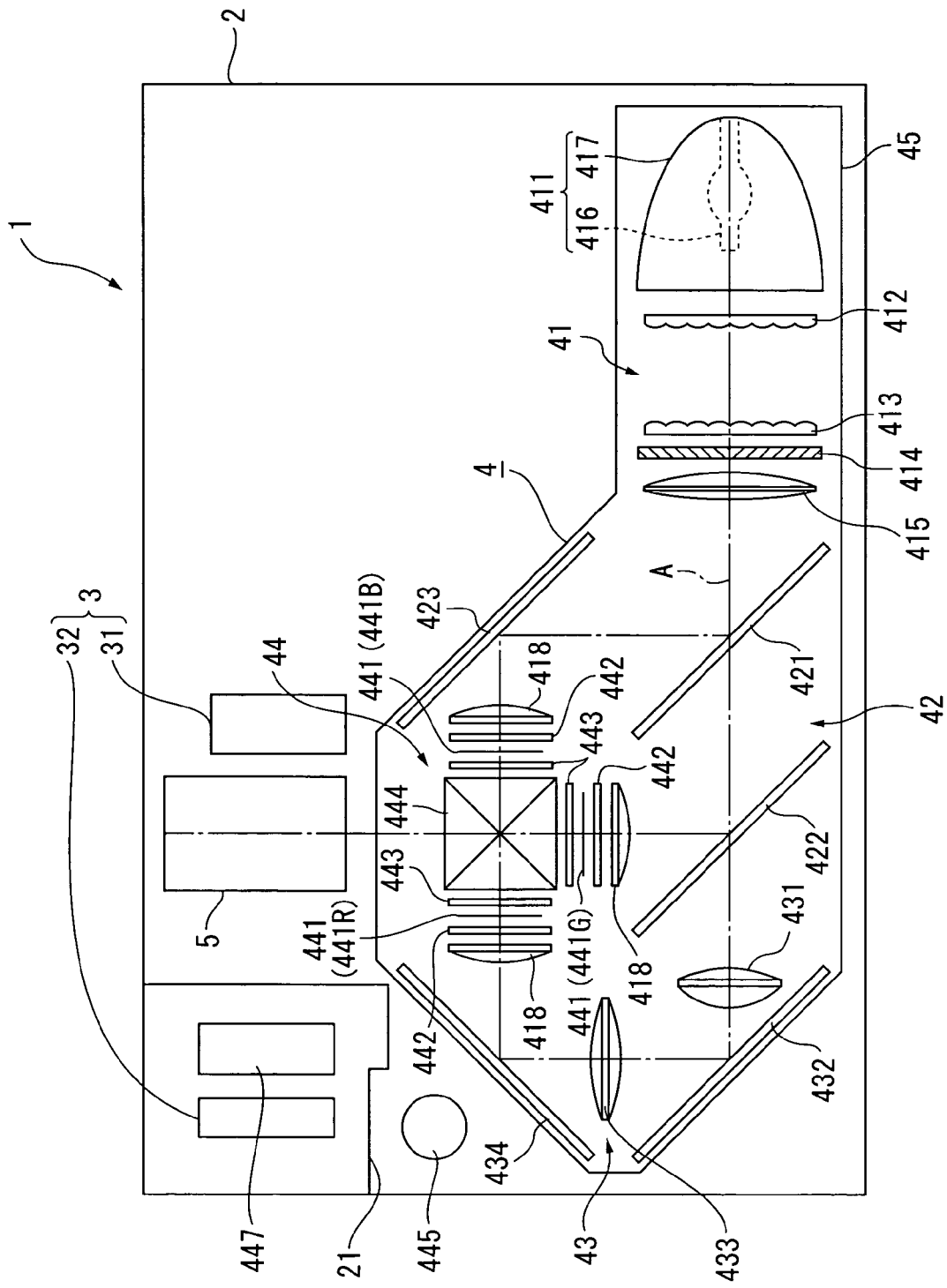
FIG. 1 is a schematic illustration showing a projector of respective exemplary embodiments of the present invention.

FIG. 1 is a schematic illustration showing the outline of a projector 1.

The projector 1 modulates a light beam irradiated by a light source in accordance with image information to form an optical image, and projects the formed image on a screen in an enlarged manner. The projector 1 includes an exterior case 2, a cooling unit 3, an optical unit 4 and a projection lens 5 as a projection optical device.

In FIG. 1, although not shown, a power source block, a lamp driving circuit and the like are disposed in the space not occupied by for the cooling unit 3, the optical unit 4 and the projection lens 5 in the exterior case 2.

The exterior case 2 is made of synthetic resin or the like, and formed in a substantially rectangular parallelepiped with the cooling unit 3, the optical unit 4 and the projection lens 5 housed and arranged therein. The exterior case 2, although not shown, is formed with an upper case constituting a top side, a front side, a rear side and lateral sides of the projector 1 and a lower case constituting a bottom side, a front side, lateral sides and a rear side of the projector 1. The upper case and the lower case are fixed to each other with screws or the like.

The exterior case may not necessarily be made of synthetic resin, but other materials such as metals may be used.

Although not shown, the exterior case 2 is provided with an intake vent (for example, an intake vent 22 in FIG. 2) for introducing the cooling air from outside of the projector 1 to the inside by the cooling unit 3 and an exhaust port for exhausting the air heated in the projector 1.

As shown in FIG. 1, in the exterior case 2, a partition 21 located on a side of the projection lens 5 and at a corner of the exterior case 2 is formed to separate a radiator of a later-described optical device of the optical unit 4 from other components.

The cooling unit 3 sends the cooling air into a cooling fluid path formed in the projector 1 for cooling the heat generated in the projector 1. The cooling unit 3 includes: a sirocco fan 31 located on a side of the projection lens 5 introducing the cooling air from the outside of the projector 1 to the inside thereof through the not-shown intake vent formed on the exterior case 2 to blow the cooling air onto a liquid crystal panel of the later-described optical device of the optical unit 4; and an axial flow fan 32 (cooling fan) located inside the partition 21 to introduce the cooling air from the outside of the projector 1 from the intake vent 22 (see FIG. 2) formed on the exterior case 2 to blow the cooling air onto the later-described radiator of the optical unit 4.

Although not shown, the cooling unit 3 includes a cooling fan for cooling a light source device of the later-described optical unit 4, the not-shown power source block, the lamp driving circuit and the like, in addition to the sirocco fan 31 and the axial flow fan 32.

The optical unit 4 is a unit for optically processing the light beam irradiated from the light source to form an optical image (color image) in accordance with the image information. As shown in FIG. 1, the optical unit 4 has a substantially L-shape in plan view, extending along the rear side and along the lateral side of the exterior case 2. Incidentally, the detailed arrangement of the optical unit 4 will be described later.

The projection lens 5 is a lens set of combined plural lens. The projection lens 5 projects the optical image (color image) formed by the optical unit 4 on a not-shown screen in an enlarged manner.

[Detailed Arrangement of Optical Unit]

As shown in FIG. 1, the optical unit 4 includes an integrator illumination optical system 41, a color-separating optical system 42, a relay optical system 43, an optical device 44 and an optical component casing 45 in which the optical components 41 to 43 and a later-described optical device body of the optical device 44 are housed and arranged.

The integrator illuminating optical system 41 is an optical system for substantially uniformly illuminating an image formation area of a later-described liquid crystal panel of the optical device 44. As shown in FIG. 1, the integrator illuminating optical system 41 has a light source device 411, a first lens array 412, a second lens array 413, a polarization converter 414 and a superposing lens 415.

The light source device 411 has a light source lamp 416 irradiating a radial light beam and a reflector 417 for reflecting the radial light beam irradiated from the light source lamp 416. As the light source lamp 416, halogen lamp, metal halide lamp and high-pressure mercury lamp are often used. As a reflector 417, although a parabolic mirror is employed in FIG. 1, an ellipsoidal mirror provided with a parallelizing concave lens at the light-irradiation side thereof for parallelizing the light beam reflected by the ellipsoidal reflector may alternatively be employed.

The first lens array 412 has small lenses arranged in a matrix, the lenses having substantially rectangular profile as seen in an optical axis direction. Each of the small lenses separates the light beam irradiated from the light source device 411 into a plurality of sub-beams.

The second lens array 413 is arranged approximately in the same manner as the first lens array 412, which includes small lenses arranged in a matrix. The second lens array 413 focuses the image of the small lenses of the first lens array 412 onto the later-described liquid crystal panels of the optical device 44 together with the superposing lens 415.

The polarization converter 414 is disposed between the second lens array 413 and the superposing lens 415 to convert the light from the second lens array 413 into a substantially uniform polarized light.

Specifically, the respective sub-beams converted into the substantially uniform polarized light by the polarization converter 414 is substantially superposed on the liquid crystal panels (described later) of the optical device 44 by the superposing lens 415 finally. Since only one-type of polarized light can be used in the projector using the liquid crystal panels that modulate polarized light, approximately half of the light beam from the light source device 411 emitting random polarized light cannot be used. Accordingly, with the use of the polarization converter 414, the light irradiated by the light source device 411 is converted into the substantially uniform polarized light to enhance the light utilization efficiency of the optical device 44.

As shown in FIG. 1, the color-separating optical system 42 has two dichroic mirrors 421 and 422, and a reflection mirror 423, and separates the plurality of sub-beams irradiated from the integrator illuminating optical system 41 by the dichroic mirrors 421 and 422 into three color lights of red (R), green (G) and blue (B).

As shown in FIG. 1, the relay optical system 43 has an incident-side lens 431, a relay lens 433 and reflection mirrors 432 and 434, and guides red light separated by the color-separating optical system 42 to the liquid crystal panel for red light (described later) of the optical device 44.

At this time, the dichroic mirror 421 of the color-separating optical system 42 reflects a blue light component of the light beam irradiated by the integrator illuminating optical system 41 and transmits a red light component and a green light component. The blue light reflected by the dichroic mirror 421 is reflected by the reflection mirror 423, which reaches to the liquid crystal panel for blue light (described later) of the optical device 44 through a field lens 418. The field lens 418 converts the respective sub-beams irradiated by the second lens array 413 into a light beam parallel to the central axis (main beam) thereof. The field lenses 418 provided on the light-incident side of other liquid crystal panels for green light and red light function in the same manner.

In the red and green lights transmitted through the dichroic mirror 421, the green light is reflected by the dichroic mirror 422, which reaches to the liquid crystal panel for green light (described later) of the optical device 44 through the field lens 418. On the other hand, the red light passes through the dichroic mirror 422, and further passes through the relay optical system 43 to reach the liquid crystal panel for red light (described later) of the optical device 44 through the field lens 418. Incidentally, the relay optical system 43 is used for the red light in order to avoid deterioration in the light utilization efficiency on account of light dispersion and the like caused by the longer length of the optical path of the red light than the optical paths of other color lights. In other words, the relay optical system 43 is used for directly transmitting the sub-beams incident on the incident-side lens 431 to the field lens 418. Though such arrangement is used in the present exemplary embodiment because of the longer optical path of the red light, the optical path of the blue light may alternatively be lengthened.

As shown in FIG. 1, in the optical device 44, three liquid crystal panels 441 (441R for red light, 441G for green light and 441B for blue light) as an optical modulator, three incident-side polarization plates 442 and three irradiation-side polarization plates 443 disposed on the light-incident side and the light-irradiation side of the liquid crystal panels 441, and a cross dichroic prism 444 as a color-combining optical device are integrated.

Although described later in detail, the optical device 44 includes a main tank, a fluid pressure delivery section, the radiator, a fluid circulator, a fluid branch section, an optical modulator holder and a relay tank in addition to the liquid crystal panels 441, the incident-side polarization plates 442, and the irradiation-side polarization plates 443 and cross dichroic prism 444.

Figure 8:
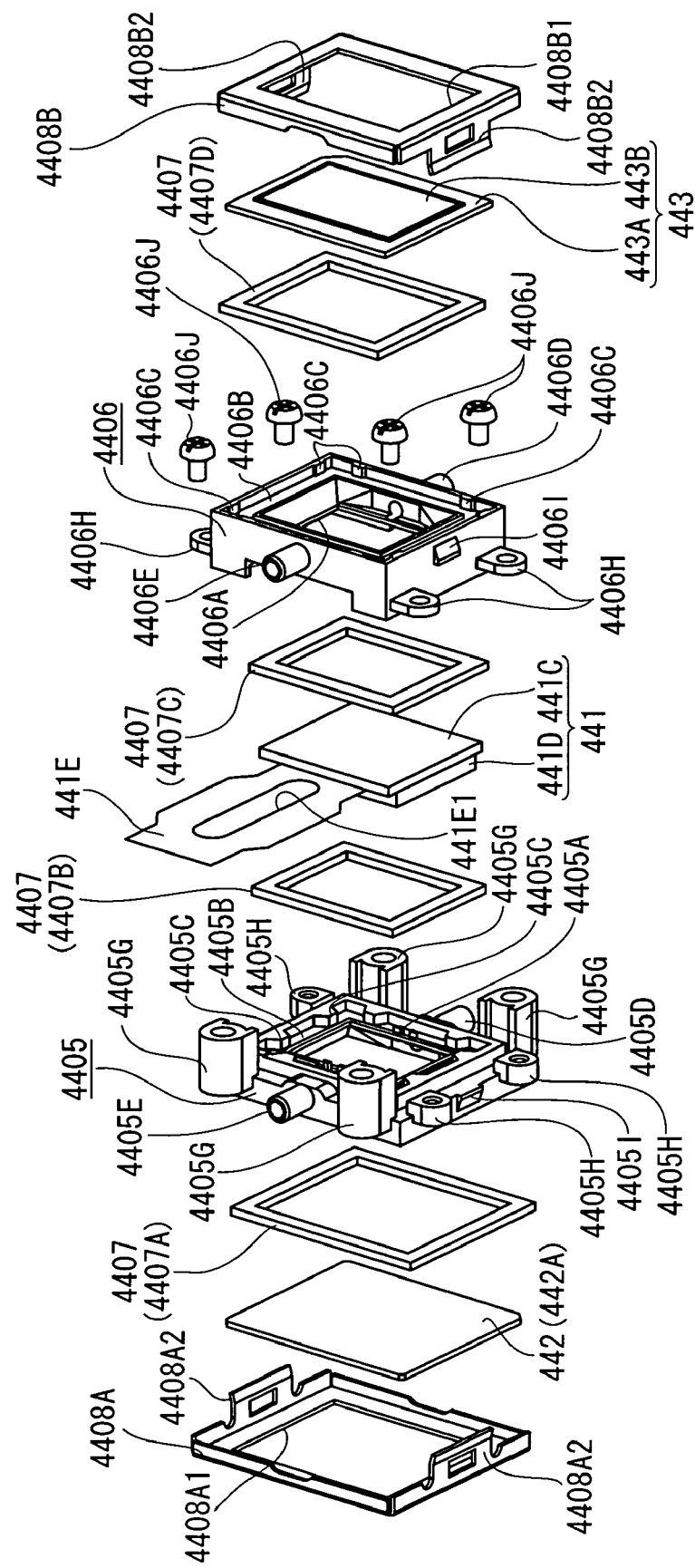
FIG. 8 is an exploded perspective view showing the outline of an optical modulator holder of the aforesaid exemplary embodiment.

The liquid crystal panel 441 includes a pair of boards 441C and 441D made of glass or the like with liquid crystal (electrooptic material) sealed therebetween (see FIG. 8). The board 441C (FIG. 8) is a driving board for driving the liquid crystal, which includes a plurality of data lines arranged in parallel to each other, a plurality of scan lines arranged in a direction orthogonal to the plurality of data lines, picture electrodes arranged in a matrix corresponding to the crossing defined by the scan lines and the data lines, and a switching element such as TFT (Thin Film Transistor) or MIM (Metal Insulator Metal) electrically connected with the data lines, the scan lines and the picture electrodes. The board 441D (FIG. 8) is an opposing board disposed opposite to the board 441C with a predetermined space therebetween, which includes common electrodes to which a predetermined voltage is applied. The boards 441C and 441D are electrically connected with a not-shown controller, to which a flexible printed board 441E (FIG. 8) as a circuit board for outputting a predetermined driving signal to the scan lines, the data lines, the common electrodes and the like is connected. By outputting the driving signal from the controller through the flexible printed board 441E (FIG. 8), a predetermined voltage is applied between the selected picture electrode and the common electrode, so that orientation of the liquid crystal located between the picture electrode and the common electrode is controlled, and thereby the polarization direction of the polarized light beam irradiated from the irradiation-side polarization plate 442 is modulated.

In the flexible printed board 441E (FIG. 8), the insertion hole 441E1 extending in the extending direction of the flexible printed board 441E is formed substantially at the center in the width direction. A later-described fluid circulator is inserted into the insertion hole 441E1.

The respective color lights with their polarization direction aligned in substantially uniform direction by the polarization converter 414 are incident on the incident-side polarization plates 442, which only transmit the polarized light having substantially the same direction as the polarization axis of the light beam aligned by the polarization converter 414 and absorb the other incident light beams. The incident-side polarization plate 442 has a transmissive board 442A (FIG. 8) made of sapphire glass, quarts crystal or the like on which a not-shown polarization film is attached.

The irradiation-side polarization plates 443 have substantially the same arrangement as the incident-side polarization plates 442, which only transmit the light beam having polarization axis orthogonal to a transmissive axis of the light beam in the incident-side polarization plates 442 and absorb other light beams irradiated from the liquid crystal panel 441.

The cross dichroic prism 444 is an optical element for combining the optical images irradiated by the irradiation-side polarization plates 443 and modulated for each color light to form a color image. The cross dichroic prism 444 has a square shape in plane view with four right-angle prisms attached with each other, and two dielectric multi-layered films are formed on the boundaries adhering the respective right-angle prisms. The dielectric multi-layered films reflect the color lights irradiated from the liquid crystal panels 441R and 441B and transmitted through the irradiation-side polarization plates 443, and transmit the color light irradiated from the liquid crystal panel 441G and transmitted through the irradiation-side polarization plate 443. The respective color lights modulated by the respective liquid crystal panels 441R, 441G and 441B are combined to form the color image.

Figure 2:
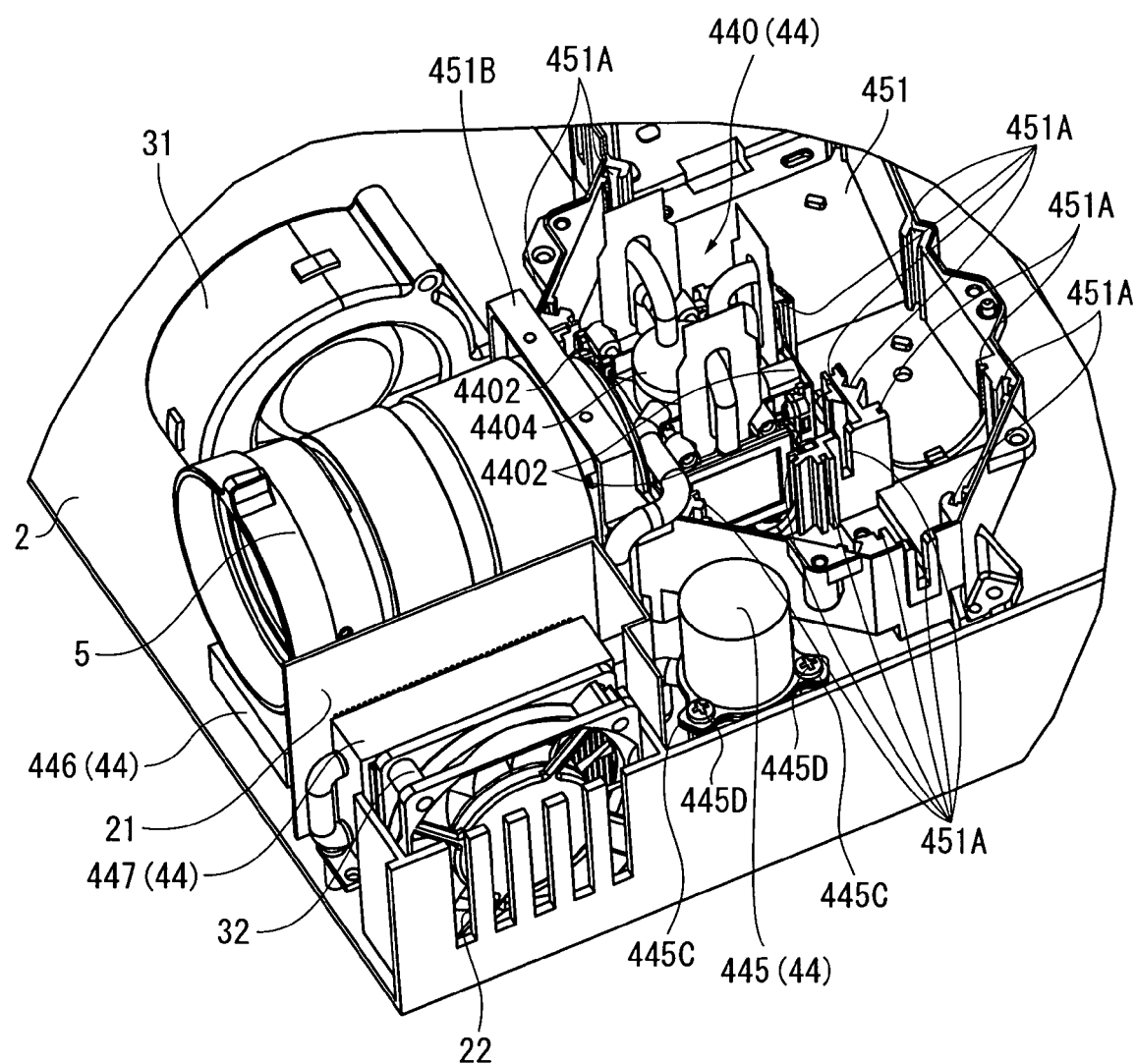
FIG. 2 is a perspective view showing a part of the upper side of the projector of the aforesaid exemplary embodiment.

FIG. 2 is a perspective view showing a part of the upper side of the projector 1. In FIG. 2, out of the optical components housed in the optical component casing 45, only the later-described optical device body of the optical device 44 is shown, while the other optical components 41 to 43 are omitted to simplify the description.

Figure 3:
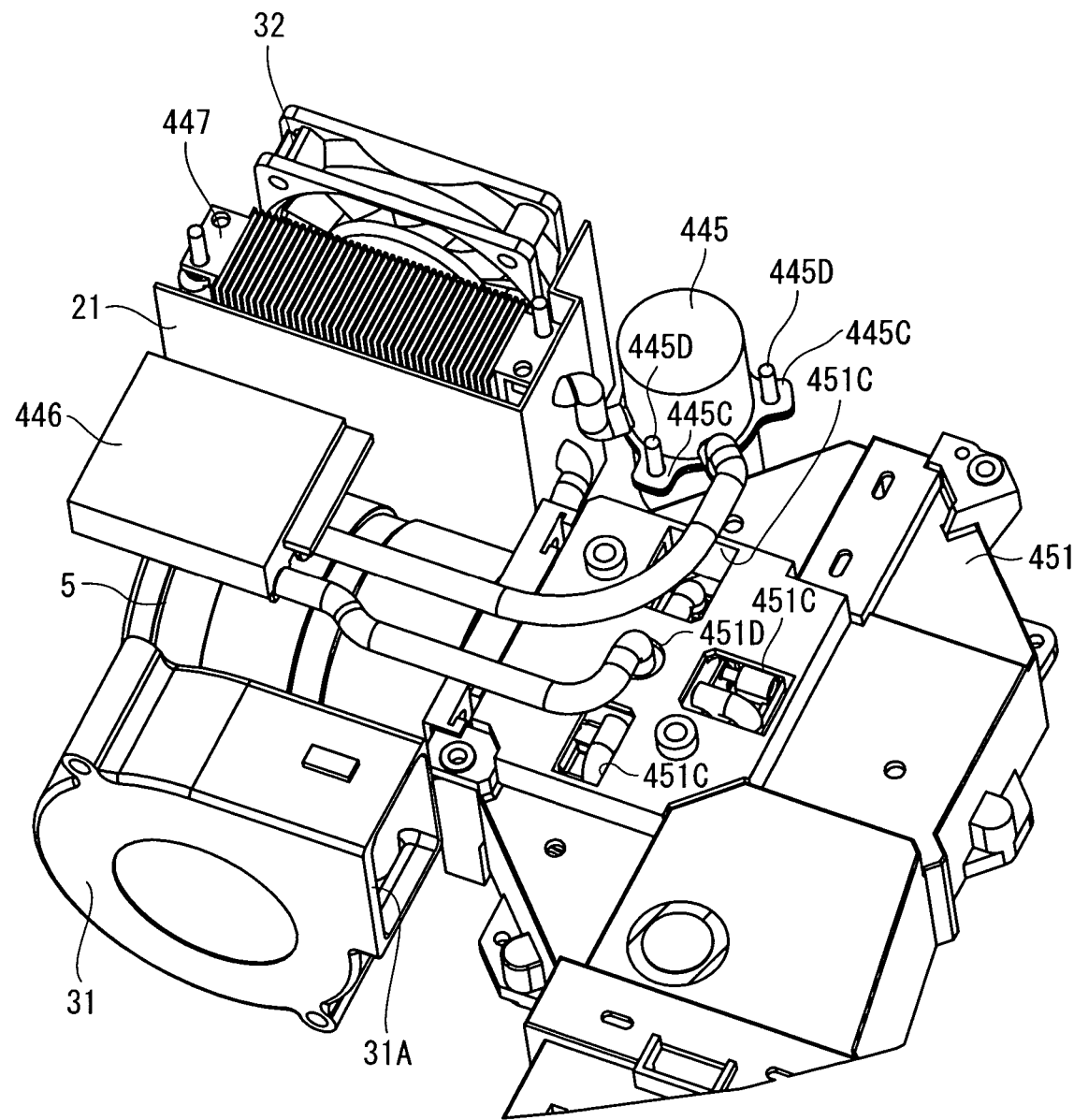
FIG. 3 is a perspective view showing a part of the lower side of the projector of the aforesaid exemplary embodiment.

FIG. 3 is a perspective view showing a part of the lower side of the projector 1.

The optical component casing 45 is, for instance, a metal component, in which a predetermined illumination optical axis A is set, and the above-described optical components 41 to 43 and the later-described optical device body of the optical device 44 are housed and arranged at predetermined positions relative to the illumination optical axis A. The optical component casing 45 may not be metal but may be made of any heat-conductive materials. As shown in FIG. 2, the optical component casing 45 includes a container-like component housing member 451 for housing the optical components 41 to 43 and the later-described optical device body of the optical device 44, and a not-shown lid foreclosing an opening of the component housing member 451.

The component housing member 451 constitutes a bottom side, a front side and lateral sides of the optical component casing 45.

Grooves 451A for slidably fitting the above-described optical components 412 to 415, 418, 421 to 423, 431 to 434 from the upper side are provided on the inner wall of the lateral sides of the component housing member 451.

As shown in FIG. 2, at the front part of the lateral side, a projection lens installation section 451B for the projection lens 5 to be installed at a predetermined position relative to the optical unit 4 is formed. The projection lens installation section 451B is formed in a substantially rectangular shape in plan view, and substantially at the center in plan view, a not-shown circular hole is formed corresponding to a light-irradiation position from the optical device 44, so that the color image formed by the optical unit 4 is projected by the projection lens 5 through the hole in an enlarged manner.

In the component housing member 451, as shown in FIG. 3, formed on the bottom side are three holes 451C provided corresponding to position of the liquid crystal panel 441 of the optical device 44, and a hole 451D provided corresponding to a later-described cooling fluid inflow section of the later-described fluid branch section of the optical device 44. The cooling air introduced from the outside of the projector 1 to the inside by the sirocco fan 31 in the cooling unit 3 is discharged from a discharge vent 31A (FIG. 3) of the sirocco fan 31, and guided to the holes 451C through a not-shown duct.

[Arrangement of Optical Device]

Figure 4:
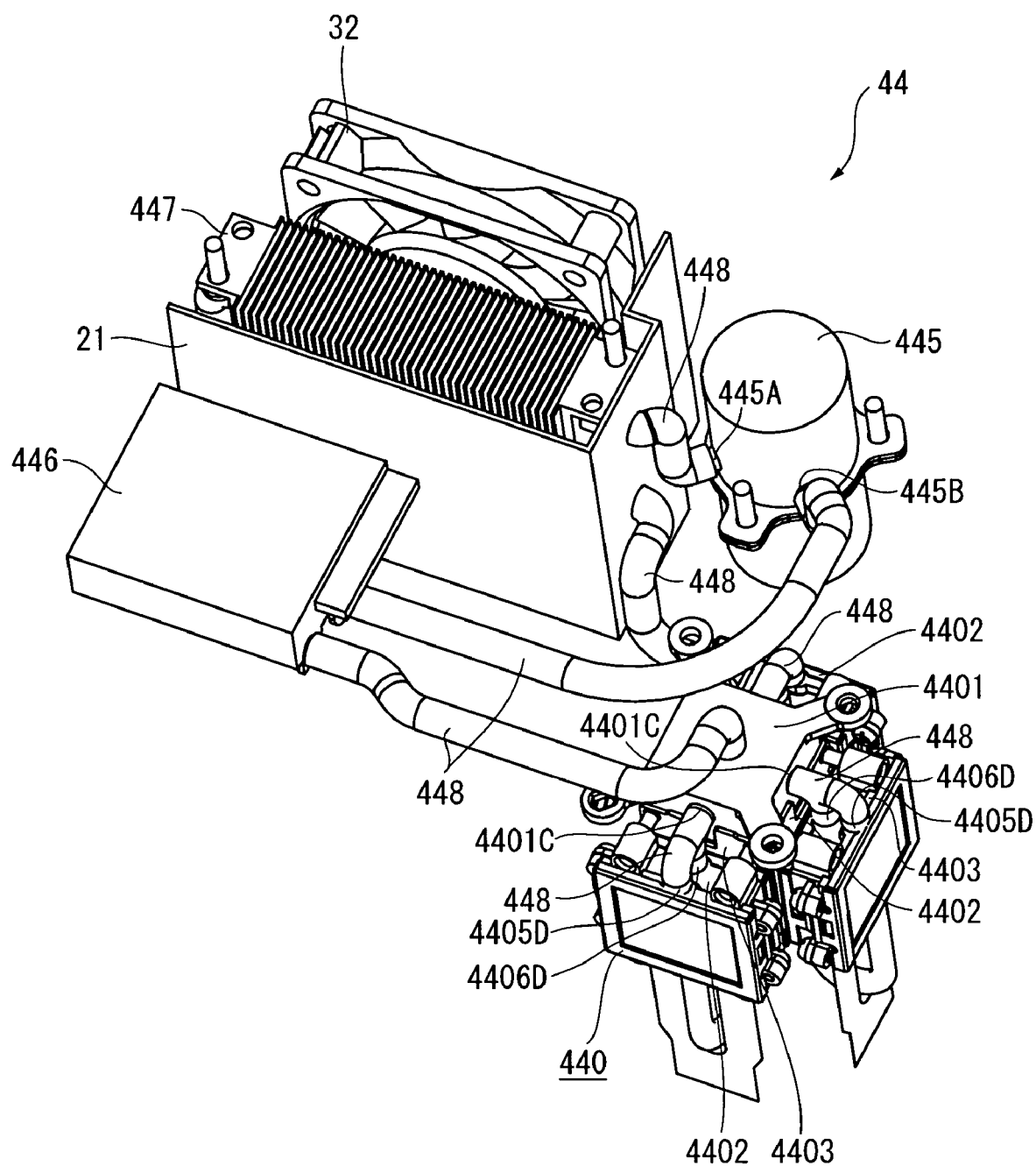
FIG. 4 is a perspective view showing a lower side of an optical device of the aforesaid exemplary embodiment.

FIG. 4 is a perspective view showing a lower side of the optical device 44.

As shown in FIGS. 2 to 4, the optical device 44 includes an optical device body 440 in which the liquid crystal panel 441, the incident-side polarization plate 442, the irradiation-side polarization plate 443 and the cross dichroic prism 444 are integrated, a main tank 445, a fluid pressure delivery section 446, a radiator 447 and a plurality of fluid circulators 448.

The plurality of fluid circulators 448 are aluminum tubular members in which the cooling fluid convects, the fluid circulators 448 so connecting the respective components 440, 445 to 447 that the cooling fluid can circulate. The circulating cooling fluid cools the heat generated at the liquid crystal panel 441, the incident-side polarization plate 442 and the irradiation-side polarization plate 443 of the optical device body 440.

In the present exemplary embodiment, ethylene glycol being a transparent nonvolatile liquid is used as the cooling fluid. For the cooling fluid, liquids other than ethylene glycol may be used.

The respective components 440, 445 to 447 will be described below in order from the one in the upper stream relative to the liquid crystal panel 441 along the flow path of the circulating cooling fluid.

[Arrangement of Main Tank]

Figure 5A:
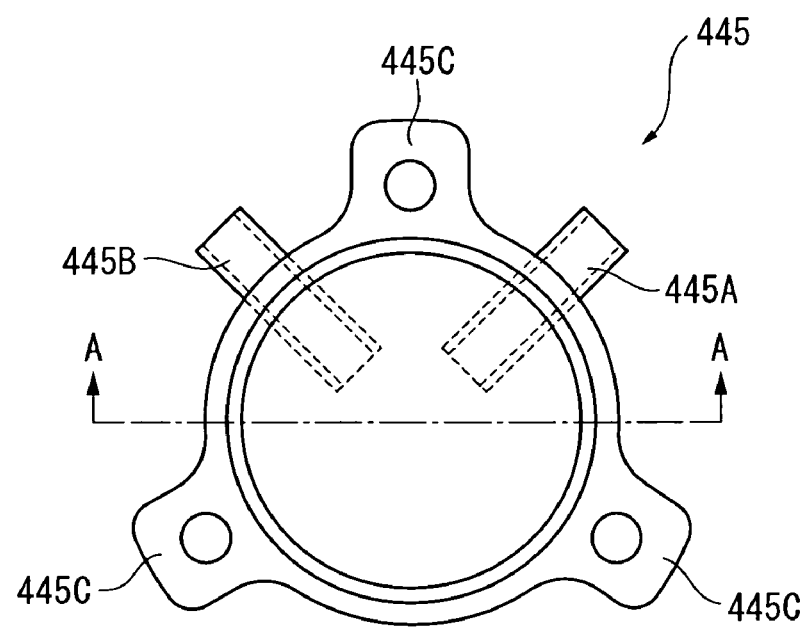
FIG. 5A is a plan view showing the arrangement of a main tank of the aforesaid exemplary embodiment.
Figure 5B:
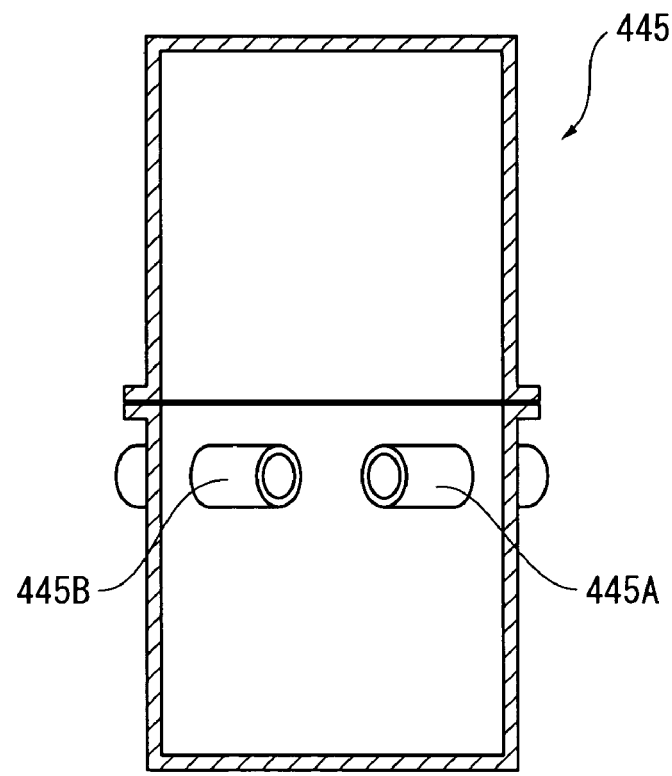
FIG. 5B is a cross section taken along line A—A in FIG. 5A.

FIGS. 5A and 5B are illustrations each showing the arrangement of the main tank 445. Specifically, FIG. 5A is a plan view showing an upper side at the main tank. FIG. 5B is a cross section taken along line A—A in FIG. 5A.

The main tank 445 has a substantially cylindrical shape, and is formed with two aluminum container-like members. By connecting opening portions of the two container-like members to each other, the cooling fluid can be temporarily housed therein. The container-like members, for instance, are connected to each other by seal welding or with an elastic member such as rubber interposed therebetween.

As shown in FIG. 5B, in the main tank 445, a cooling fluid inflow section 445A for introducing the cooling fluid to the inside thereof and a cooling fluid outflow section 445B for discharging the cooling fluid to the outside are formed substantially at the center portion in a cylinder axis direction.

The inflow section 445A and the outflow section 445B are substantially cylindrical members having tube diameter smaller than the tube diameter of the fluid circulator 448, which project toward inside and outside of the main tank 445. An outwardly-projecting end of the inflow section 445A is connected to an end of the fluid circulator 448, and the cooling fluid is introduced into the main tank 445 from the outside through the fluid circulator 448. An outwardly-projecting end of the outflow section 445B is also connected to an end of another fluid circulator 448, and the cooling fluid in the main tank 445 is discharged to the outside through the fluid circulator 448.

As shown in FIG. 5A, the inwardly-projecting ends of the inflow section 445A and the outflow section 445B extend toward the cylinder axis of the main tank 445, the inflow and outflow sections being disposed to be substantially orthogonal to each other in plan view. With such arrangement, the cooling fluid introduced into the main tank 445 through the inflow section 445A can be prevented from being directly discharged from the outflow section 445B. Thus, the introduced cooling fluid is mixed with the one in the main tank 445, so that the temperature of the cooling fluid can be uniformed.

As shown in FIG. 5A, on an outer circumferential surface of the main tank 445, three fixtures 445C are provided to each of the two container-like members substantially at the center of the cylinder axis direction. By inserting screws 445D (FIGS. 2 and 3) into the fixtures 445C to screw with the bottom side of the exterior case 2, the two container-like members are tightly connected with each other, and further, the main tank 445 is fixed to the exterior case 2.

As shown in FIGS. 1 and 2, the main tank 445 is disposed in an area defined by the optical component casing 45 and the inner side of the exterior case 2, the area having a substantially triangle shape in plan view. By disposing the main tank 445 in the area, housing efficiency of the exterior case 2 can be improved, so that size increase of the projector 1 can be avoided.

[Arrangement of Fluid Pressure Delivery Section]

The pressure delivery section 446 introduces the cooling fluid housed in the main tank 445 and forcibly sends the cooling fluid to the outside. Thus, as shown in FIG. 4, the pressure delivery section 446 is connected to an end of the fluid circulator 448 being connected to the outflow section 445B of the main tank 445, and is connected to an end of another fluid circulator 448 for sending the cooling fluid to the outside.

Although not shown in detail, the pressure delivery section 446 is, for instance, an aluminum hollow member having substantially rectangular parallelepiped with an impeller disposed therein. By rotating the impeller under control of a not-shown controller, the cooling fluid housed in the main tank 445 is forcibly introduced through the fluid circulator 448 and the introduced cooling fluid is forcibly discharged through the fluid circulator 448. With such arrangement, the thickness of the pressure delivery section 446 can be reduced in rotation axis direction of the impeller, thereby allowing installation at an empty space in the projector 1. In the present exemplary embodiment, the pressure delivery section 446 is disposed on the lower side of the projection lens 5 as shown in FIGS. 2 and 3.

[Arrangement of Optical Device Body]

Figure 6:
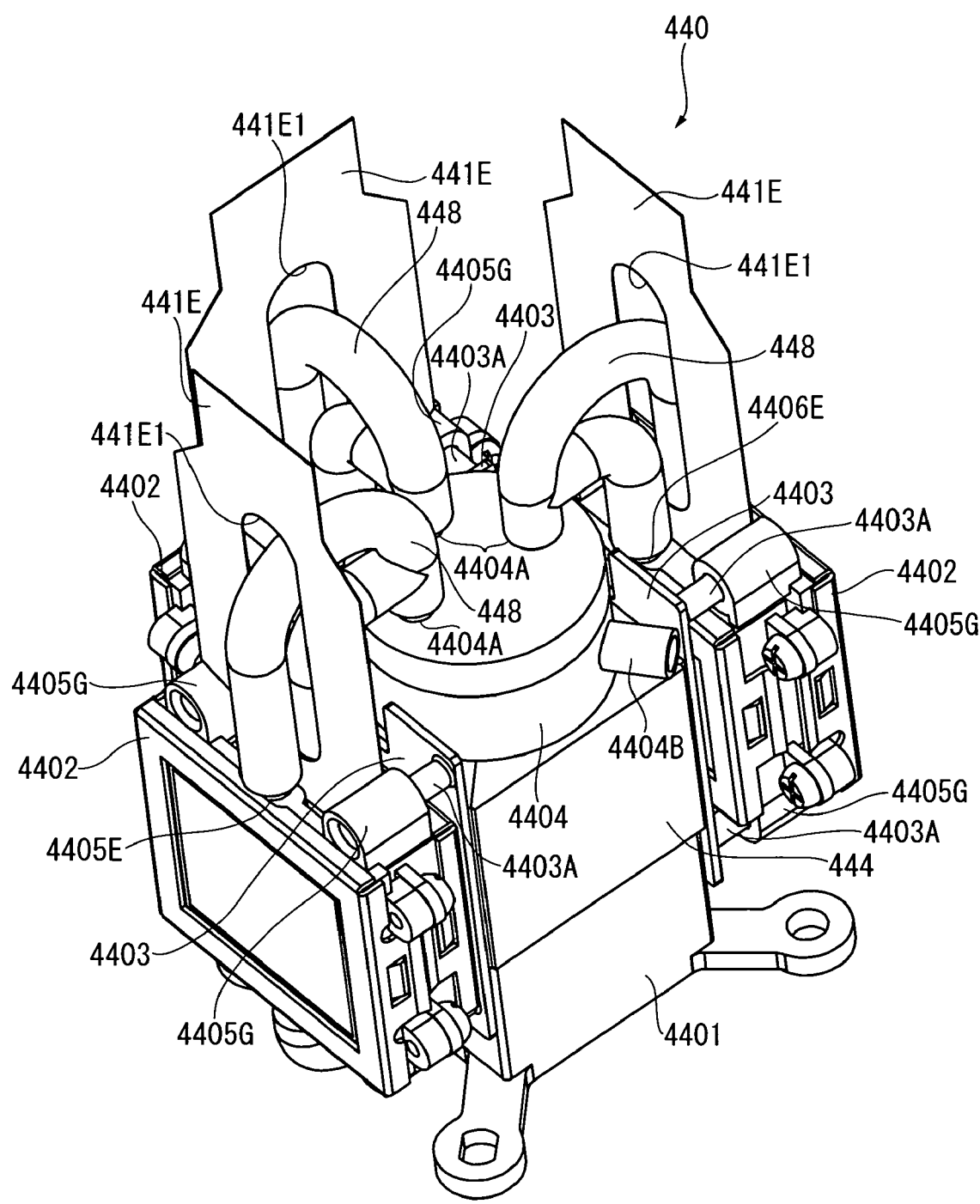
FIG. 6 is a perspective view showing the outline of an optical device body of the aforesaid exemplary embodiment.

FIG. 6 is a perspective view showing the arrangement of the optical device body 440.

As shown in FIG. 6, the optical device body 440 includes a fluid branch section 4401, three optical modulator holders 4402, three support members 4403, and a relay tank 4404 as a cooling fluid relaying section in addition to the three liquid crystal panels 441, three incident-side polarization plates 442, three irradiation-side polarization plates 443 and cross dichroic prism 444.

[Arrangement of Fluid Branch Section]

Figure 7A:
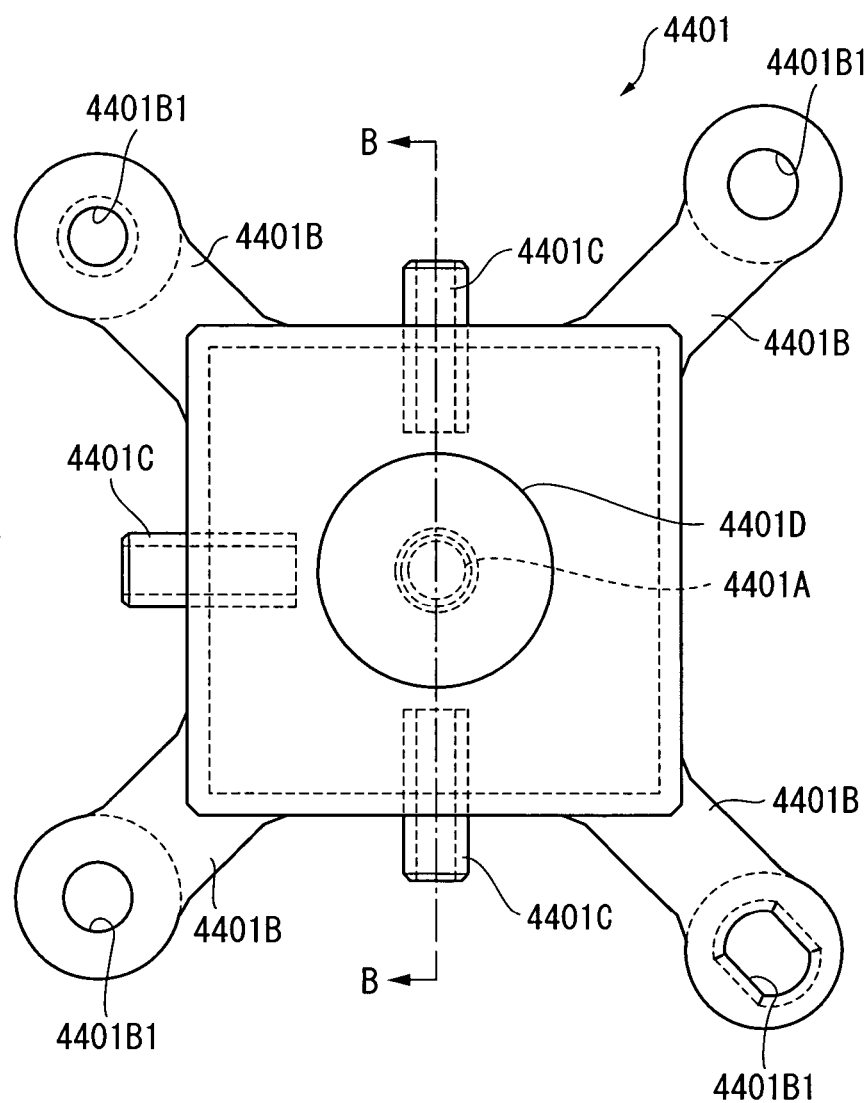
FIG. 7A is a plan view showing the arrangement of a fluid branch section of the aforesaid exemplary embodiment.
Figure 7B:
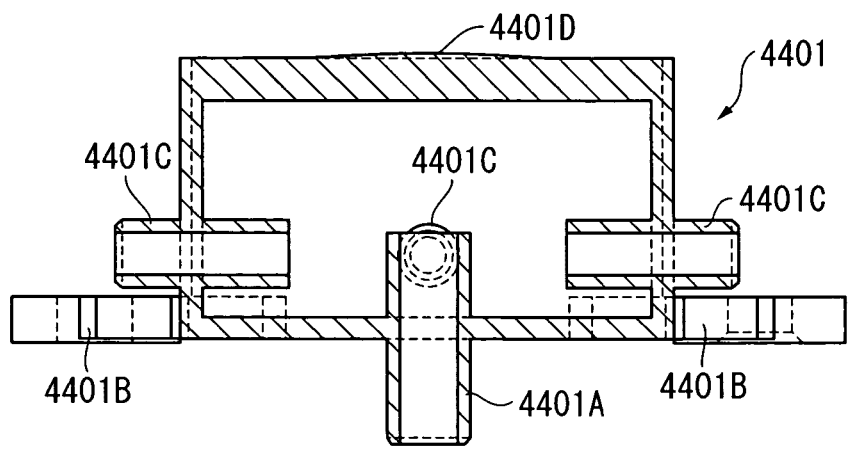
FIG. 7B is a cross section taken along line B—B in FIG. 7A.

FIGS. 7A and 7B are illustrations each showing the arrangement of the fluid branch section 4401. Specifically, FIG. 7A is a plan view showing an upper side of the branch section 4401. FIG. 7B is a cross section taken along line B—B in FIG. 7A.

The branch section 4401 is an aluminum hollow member having substantially rectangular parallelepiped shape, which forcibly introduces the cooling fluid from the pressure delivery section 446 and branches the introduced cooling fluid to send for each of the three optical modulator holders 4402. The branch section 4401 is fixed to the bottom side being orthogonal to three surfaces at the light-incident side of the cross dichroic prism 444, which functions as a prism fixing plate for supporting the cross dichroic prism 444.

In the branch section 4401, a cooling fluid inflow section 4401A is formed substantially at the center of the bottom side to introduce the cooling fluid delivered from the pressure delivery section 446 to the inside thereof, as shown in FIG. 7B. The inflow section 4401A, as with the inflow section 445A in the main tank 445, is substantially cylindrical members having tube diameter smaller than the tube diameter of the fluid circulator 448, which project toward inside and outside of the branch section 4401. An outwardly-projecting end of the inflow section 4401A is connected to an end of the fluid circulator 448 being connected to the pressure delivery section 446, so that the cooling fluid delivered from the pressure delivery section 446 is introduced into the branch section 4401 through the fluid circulator 448.

As shown in FIG. 7A, at four corners of the bottom side, arms 4401B extending along the bottom side are respectively formed. Holes 4401B1 are respectively formed at the tip ends of the arms 4401B. By inserting not-shown screws into the holes 4401B1 and screwing the screws into the component housing member 451 of the optical component casing 45, the optical device body 440 is fixed to the component housing member 451 (see FIGS. 11A and 11B). At this time, the branch section 4401 and the optical component casing 45 are connected to each other so that heat can be transferred. By connecting the branch section 4401 to the optical component casing 45, a heat transfer path from the circulating cooling fluid to the branch section 4401 and to the optical component casing 45 is secured so that the cooling efficiency of the cooling fluid can be improved. If the air sent from the sirocco fan 31 is blown along the bottom side of the optical component casing 45, heat releasing area of the circulating cooling fluid can be increased, thereby further improving cooling efficiency.

As shown in FIG. 7A, cooling fluid outflow sections 4401C are formed on the three sides of the branch section 4401 corresponding to at the light-irradiation sides of the cross dichroic prism 444, the outflow sections 4401C branching the introduced cooling fluid to be discharged to each of the three optical modulator holders 4402.

The outflow sections 4401C, as with the inflow section 4401A, are substantially cylindrical members having tube diameter smaller than the tube diameter of the fluid circulator 448, which project toward inside and outside of the branch section 4401. Each of the outwardly-projecting ends of the outflow sections 4401C is connected to an end of the fluid circulator 448, so that the cooling fluid in the branch section 4401 is discharged to the outside through the fluid circulator 448.

In the branch section 4401, as shown in FIGS. 7A and 7B, a spherical bulged section 4401D is formed substantially at the center of the upper side. By attaching the bulged section 4401D to the bottom side of the cross dichroic prism 444, the position of the cross dichroic prism 444 in tilting direction can be adjusted relative to the branch section 4401.

[Arrangement of Optical Modulator Holder]

FIG. 8 is an exploded perspective view showing the outline of the optical modulator holder 4402.

The three optical modulator holders 4402 respectively hold the three liquid crystal panels 441, the three incident-side polarization plates 442 and the three irradiation-side polarization plates 443 while respectively cooling the three liquid crystal panels 441, the three incident-side polarization plates 442 and the three irradiation-side polarization plates 443, the optical modulator holders 4402 having the cooling fluid introduced into and discharged from the inside thereof. Each of the optical modulator holders 4402 has the same arrangement, and thus only one of the optical modulator holders 4402 will be described below.

As shown in FIG. 8, the optical modulator holder 4402 includes a pair of frame members 4405 and 4406, four elastic members 4407, and a pair of polarization plate fixtures 4408A and 4408B.

The frame member 4405 is an aluminum frame having a substantially rectangular shape in plan view with a rectangular opening 4405A substantially at the center thereof corresponding to an image formation area of the liquid crystal panel 441. The frame member 4405 is disposed on the light-incident side relative to the frame member 4406, which supports the light-incident side of the liquid crystal panel 441 and the light-irradiation side of the incident-side polarization plate 442.

Figure 9:
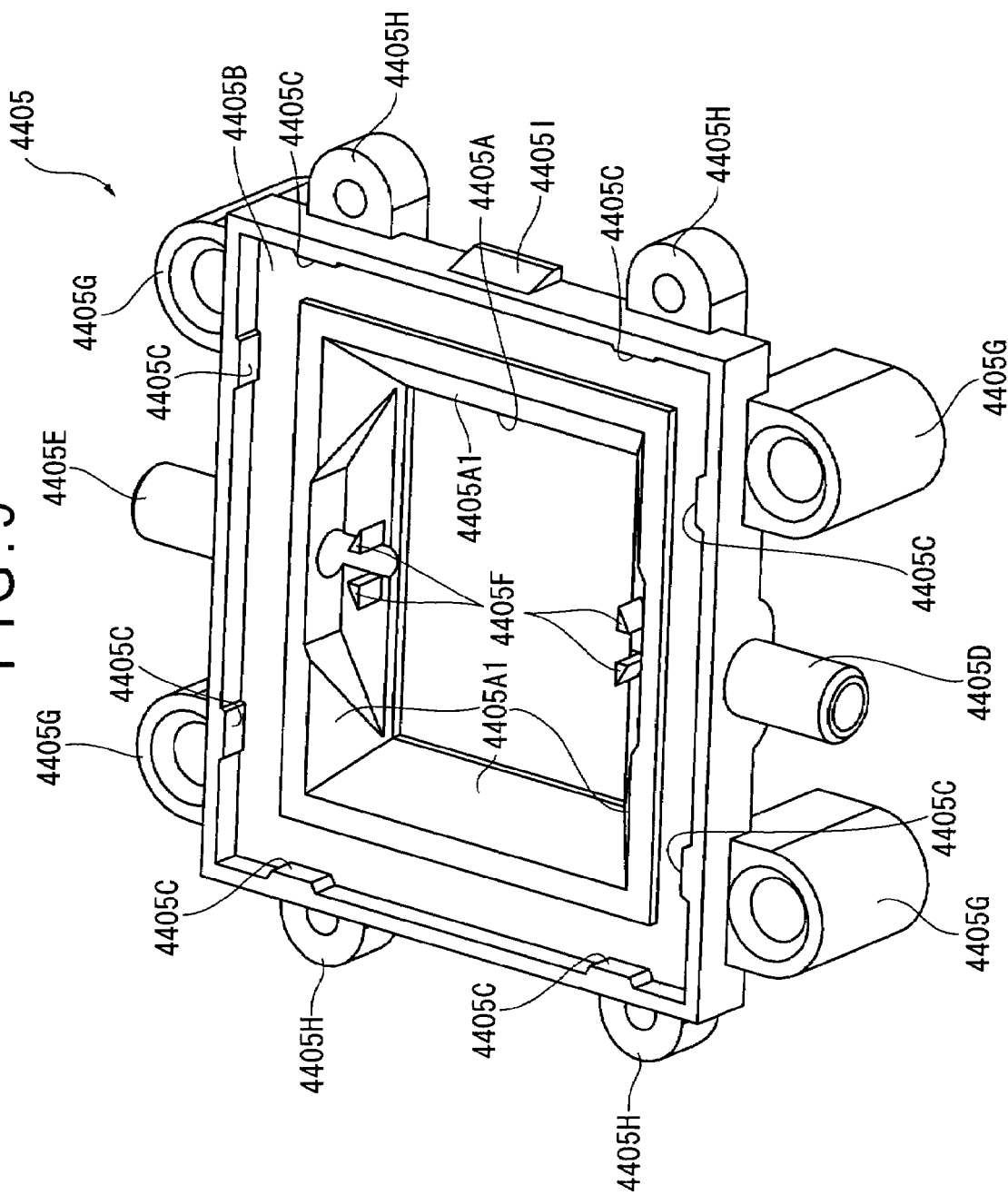
FIG. 9 is a perspective view showing a frame member of the aforesaid exemplary embodiment from the light-incident side.

FIG. 9 is a perspective view showing the frame member 4405 from the light-incident side.

As shown in FIG. 9, in the frame member 4405, a cavity 4405B having a rectangular frame shape corresponding to the shape of a later-described first elastic member of the elastic members 4407 is formed on the light-incident side, so that the incident-side polarization plate 442 is supported by the cavity 4405B with the first elastic member interposed therebetween. Since the frame member 4405 supports the irradiation side of the incident-side polarization plate 442, the light-incident side of an opening 4405A is closed with the first elastic member and the light-irradiation side of the incident-side polarization plate 442. On an outer circumferential edge of the cavity 4405B, a plurality of engaging projections 4405C are formed. The engaging projections 4405C contact with the outer side of the elastic member 4407 so that the elastic member 4407 is positioned and set in the cavity 4405B.

As shown in FIG. 9, the opening 4405A has an inclined side 4405A1 formed by chamfering the corners of the light-incident side so that the opening area in enlarged from the light-irradiation side toward the light-incident side.

As shown in FIG. 8, in the frame member 4405, a cavity 4405B having a rectangular frame shape corresponding to the shape of a later-described second elastic member of the elastic members 4407 is also formed on the light-irradiation side as with the light-incident side, so that the light-incident side of the liquid crystal panel 441 is supported by the cavity 4405B with the second elastic member interposed therebetween. Since the frame member 4405 supports the incident side of the liquid crystal panel 441, the light-irradiation side of the opening 4405A is closed with the second elastic member and the light-incident side of the liquid crystal panel 441. The engaging projections 4405C are also formed on the light-irradiation side at the outer circumferential surface of the cavity 4405B.

When the light-incident side and the light-irradiation side of the opening 4405A are closed with the liquid crystal panel 441 and the incident-side polarization plate 442 as described above, a cooling chamber R1 (FIG. 12) is formed so that the cooling fluid can be sealed in the frame member 4405.

As shown in FIG. 9, in the frame member 4405, an inflow port 4405D for introducing the cooling fluid discharged from the outflow section 4401C of the branch section 4401 to the inside is formed substantially at the center of the lower side. The inflow port 4405D is a substantially cylindrical member having tube diameter smaller than that of the fluid circulator 448, which is so formed to project toward outside of the frame member 4405. The projection end of the inflow port 4405D is connected to an other end of the fluid circulator 448 being connected to the outflow section 4401C of the branch section 4401, so that the cooling fluid discharged from the branch section 4401 is introduced into the cooling chamber R1 (FIG. 12) of the frame member 4405 through the fluid circulator 448.

As shown in FIG. 9, in the frame member 4405, an outflow port 4405E for discharging the cooling fluid in the cooling chamber R1 (FIG. 12) of the frame member 4405 to the outside is formed substantially at the center of the upper side. In other words, the outflow port 4405E is formed at a position opposing the inflow port 4405D. The outflow port 4405E, as with the inflow port 4405D, is a substantially cylindrical member having tube diameter smaller than that of the fluid circulator 448, which is so formed to project toward outside of the frame member 4405. The projection end of the outflow port 4405E is connected to the fluid circulator 448, so that the cooling fluid in the cooling chamber R1 (FIG. 12) is discharged to the outside through the fluid circulator 448.

As shown in FIG. 9, on the periphery of the opening 4405A, concave sections are formed around the portions communicating with the inflow port 4405D and the outflow port 4405E, the outer side of the concave sections being narrowed toward the portions.

Two rectifying section 4405F are formed on the bottom side of the concave section. The rectifying sections 4405F have a substantially right triangle cross section, which are disposed with a predetermined space therebetween with the oblique line of each right triangle extended in a direction away from the portion.

As shown in FIG. 9, four insertions 4405G for later-described pins of the support members 4403 to be inserted are formed at upper corners and lower corners of the frame member 4405.

Further, as shown in FIG. 9, connecting sections 4405H to be connected to the frame member 4406 are formed at right end corners and left end corners of the frame member 4405.

Further, as shown in FIG. 9, in the frame member 4405, hooks 4405I for polarization plate fixtures 4408A to be engaged are formed substantially at the horizontal center.

The frame member 4406 is an aluminum member, which sandwiches the liquid crystal panel 441 with the frame member 4405 with a later-described third elastic member of the elastic members 4407 interposed therebetween, while supporting the light-irradiation polarization plate 443 with a late-described fourth elastic member of the elastic members 4407 interposed therebetween at a side opposite to a side opposing the frame member 4405. The specific arrangement of the frame member 4406 is substantially the same as the frame member 4405. That is, the frame member 4406 is provided with an opening 4406A (including not-shown inclined surfaces), concave sections 4406B, engaging projections 4406C, an inflow port 4406D, an outflow port 4406E, not-shown rectifying sections, connecting sections 4406H, and hooks 4406I, respectively identical with the opening 4405A (including the inclined surfaces 4405A1), the cavities 4405B, the engaging projections 4405C, the inflow port 4405D, the outflow port 4405E, the rectifying sections 4405F, the connecting sections 4405H and the hooks 4405I provided to the frame member 4405.

As shown in FIG. 4, the fluid circulator 448 connecting the outflow section 4401C of the branch section 4401 and each of the inflow ports 4405D and 4406D of the frame members 4405 and 4406 an end branched in two ways. In other words, the cooling fluid discharged from the outflow section 4401C of the branch section 4401 is branched into two through the fluid circulator 448 and introduced into the respective cooling chambers R1 and R2 of the respective frame members 4405 and 4406.

By screwing screws 4406J (FIG. 8) into the respective connecting sections 4405H and 4406H of the frame members 4405 and 4406, the liquid crystal panel 441 is sandwiched between the frame members 4405 and 4406 with the later-described second and third elastic members of the elastic members 4407 respectively interposed therebetween, so that the opposing sides of the respective opening 4405A and 4406A of the frame members 4405 and 4406 are sealed.

The four elastic members 4407 are formed in substantially rectangular frame shape, which seal the respective cooling chambers R1 and R2 (FIG. 12) of the frame members 4405 and 4406 to prevent leakage of the cooling fluid. As shown in FIG. 8, the elastic members 4407 include a first elastic member 4407A interposed between the incident-side polarization plate 442 and the frame member 4405, a second elastic member 4407B interposed between the frame member 4405 and the liquid crystal panel 441, a third elastic member 4407C interposed between the liquid crystal panel 441 and the frame member 4406 and a fourth elastic member 4407D interposed between the frame member 4406 and the irradiation-side polarization plate 443.

The elastic member 4407 is made of a silicone rubber having elasticity, in which surface treatment for enhancing crosslinking density of surface layers is cibducted on both sides or one side. For example, as the elastic member 4407, SARCON GR-d series (trademark of Fuji Polymer Industries Co., Ltd.) can be employed. Due to the surface treatment provided on the side, the elastic members 4407 can be easily set in the respective cavities 4405B and 4406B of the frame members 4405 and 4406.

As the elastic members 4407, butyl rubber, fluorocarbon rubber and the like having low moisture permeability may also be employed.

The polarization plate fixtures 4408A and 4408B press and fix the incident-side polarization plate 442 and the irradiation-side polarization plate 443 to the cavities 4405B and 4406B of the frame members 4405 and 4406 with the elastic members 4407 interposed therebetween. The polarization plate fixtures 4408A and 4408B have a rectangular frame shape in plan view with openings 4408A1 and 4408B1 formed substantially at the center thereof. The peripheries of the openings 4408A1 and 4408B1 respectively press and fix the incident-side polarization plate 442 and irradiation-side polarization plate 443 to the frame members 4405 and 4406. The polarization plate fixtures 4408A and 4408B are respectively provided with hook engaging sections 4408A2 and 4408B2 at the right and left edges. By engaging the hook engaging sections 4408A2 and 4408B2 with the respective hooks 4405I and 4406I of the frame members 4405 and 4406, the polarization plate fixtures 4408A and 4408B are fixed to the frame members 4405 and 4406 with the incident-side polarization plate 442 and irradiation-side polarization plate 443 being pressed.

[Arrangement of Support Member]

The support member 4403 is a plate having rectangular frame shape in plan view with a not-shown opening formed substantially at the center thereof.

In the support member 4403, pins 4403A (FIG. 6) projecting from the plate are formed at locations corresponding to the four insertions 4405G of the optical modulator holders 4402 on the light-incident side.

The support member 4403 supports the optical modulator holder 4402 by inserting the pins 4403A (FIG. 6) into the four insertions 4405G of the optical modulator holder 4402, and the optical modulator holder 4402 is integrated with the cross dichroic prism 444 by adhering and fixing the light-irradiation side of the plate to the light-incident side of the cross dichroic prism 444.

[Arrangement of Relay Tank]

Figure 10A:
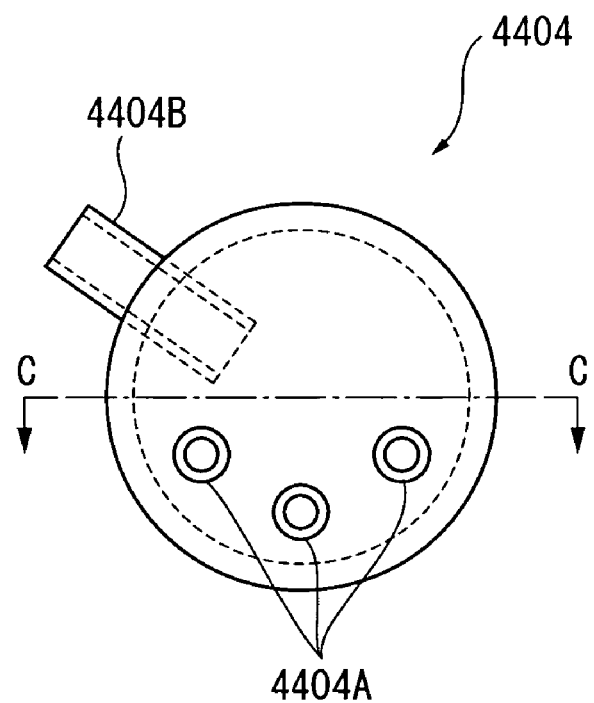
FIG. 10A is a plan view showing the arrangement of a relay tank of the aforesaid exemplary embodiment.
Figure 10B:
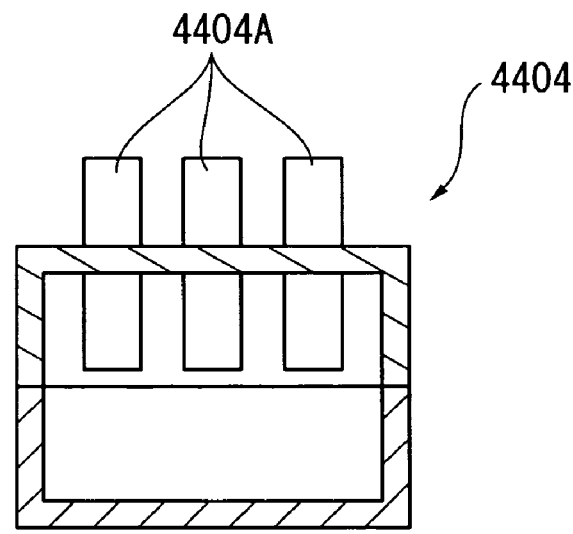
FIG. 10B is a cross section taken along line C—C in FIG. 10A.

FIGS. 10A and 10B are illustrations each showing the arrangement of a relay tank 4404. Specifically, FIG. 10A is a plan view showing an upper side of the relay tank 4404. FIG. 10B is a cross section taken along line C—C in FIG. 10A.

The relay tank 4404 is an aluminum hollow member having a substantially cylindrical shape, which is fixed to the upper side of the cross dichroic prism 444 that is orthogonal to the three light-incident sides of the cross dichroic prism 444. The relay tank 4404 collectively introduces the cooling fluid discharged from the respective optical modulator holders 4402 and discharges the introduced cooling fluid to the outside.

As shown in FIGS. 10A and 10B, three cooling fluid inflow sections 4404A are formed on the upper side of the relay tank 4404 to introduce the cooling fluid discharged from the respective frame members 4405 and 4406 of the respective optical modulator holders 4402 to the inside thereof. The inflow sections 4404A are substantially cylindrical members having tube diameter smaller than the tube diameter of the fluid circulator 448, which project toward inside and outside of the relay tank 4404. Outwardly projecting ends of the respective inflow sections 4404A are connected to ends of the fluid circulators being connected to the outflow ports 4405E and 4406E of the respective frame members 4405 and 4406 of the three optical modulator holders 4402, so that the cooling fluid discharged from the respective optical holders 4402 is collectively introduced into the relay tank 4404 through the fluid circulators 448.

As shown in FIG. 6, the fluid circulator 448 connecting each of the outflow ports 4405E and 4406E of the optical modulator holder 4402 and the inflow section 4404A of the relay tank 4404 has an end branched in two ways. One of the branched end of the fluid circulator 448 being connected to the inflow section 4404A is connected to the outflow port 4406E, and the other end is connected to the outflow port 4405E in the state being inserted into an insertion hole 441E1 of the flexible printed board 441E of the liquid crystal panel 441. That is, the cooling fluid discharged from each of the cooling chambers R1 and R2 (FIG. 12) of the optical modulator holder 4402 unite in the fluid circulator 448 to be introduced into the relay tank 4404.

As shown in FIGS. 10A and 10B, in the relay tank 4404, a cooling fluid outflow section 4404B for discharging the introduced cooling fluid to the outside is formed on the lower side of the outer side. The outflow section 4404B, as with the inflow section 4404A, is substantially cylindrical members having tube diameter smaller than the tube diameter of the fluid circulator 448, which project toward inside and outside of the relay tank 4404. An outwardly-projecting end of the outflow section 4404B is connected to an end of the fluid circulator 448, and the cooling fluid in the relay tank 4404 is discharged to the outside through the fluid circulator 448.

[Arrangement of Radiator]

Figure 11A:
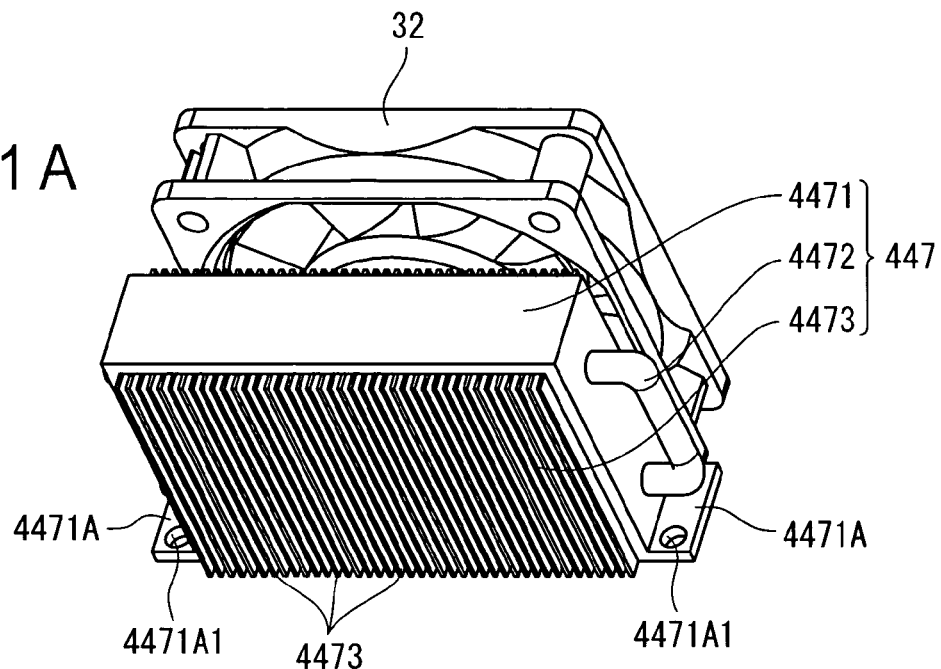
FIG. 11A is an illustration showing the arrangement of a radiator of the aforesaid exemplary embodiment and disposition between the radiator and an axial flow fan.
Figure 11B:
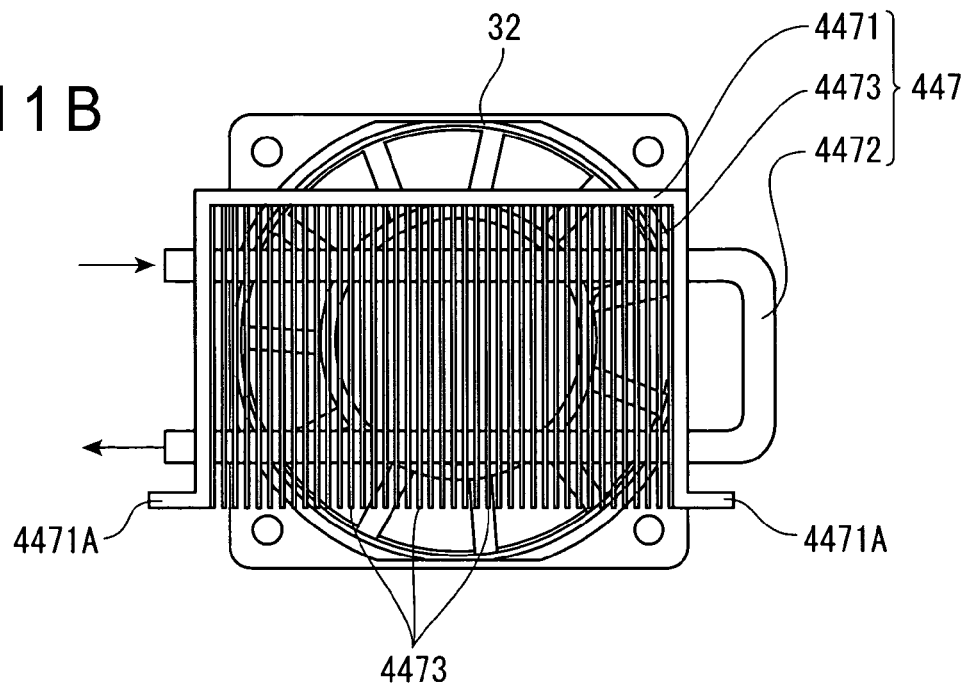
FIG. 11B is a plan view showing the radiator and the axial flow fan from the radiator side.

FIGS. 11A and 11B are illustrations showing the arrangement of the radiator 447 and a positional relationship between the radiator 447 and an axial flow fan 32. Specifically, FIG. 11A is a perspective view showing an upper side of the radiator 447 and the axial flow fan 32. FIG. 11B is a plan view showing the radiator 447 and the axial flow fan 32 from the side of the radiator 447.

As shown in FIG. 1 or 2, the radiator 447 is disposed in the partition 21 provided in the exterior case 2 to release heat of the cooling fluid heated by the respective liquid crystal panels 441, incident-side polarization plates 442, irradiation-side polarization plates 443 in the optical device body 440 As shown in FIGS. 11A and 11B, the radiator 447 includes a fixing section 4471, a tubular member 4472 and a plurality of fins 4473.

The fixing section 4471 is made of, for instance, a heat-conductive material such as metals. As shown in FIG. 11B, the fixing section 4471 has a substantially C-shape in plan view, where the tubular member 4472 can be inserted between the opposing ends of the C-shape. The fixing section 4471 supports the heat-release fins 4473 at the inner side of the C-shape. At tip ends of the C-shape of the fixing section 4471, extending sections 4471A extending outwardly are formed. By inserting not-shown screws into the exterior case 2 through holes 4471A1 of the extending sections 4471A, the radiator 447 is fixed to the exterior case 2.

The tubular member 4472 is made of aluminum. As shown in the FIG. 11B, the tubular member 4472 has a substantially U-shape in plan view, which extends from a first end of the C-shape toward a second end of the C-shape of the fixing section 4471, the extended tip end bends at substantially right angle to extend downwardly, and further, the extended tip end bends at substantially right angle to extend from the second end of the C-shape toward the first end of the C-shape, so that the heat can be transferred from the tubular member 4472 to the fixing section 4471 and the heat-release fins 4473. The tubular member 4472 has a tube diameter smaller than the tube diameter of the fluid circulator 448, and an end (upper one in FIG. 11B) of the tubular member 4472 is connected to the end of the fluid circulator 448 being connected to the outflow section 4404B of the relay tank 4404 in the optical device body 440. The other end (lower one in FIG. 11B) is connected to the end of the fluid circulator 448 being connected to the inflow section 445A of the main tank 445. Therefore, the cooling fluid discharged from the relay tank 4404 passes through the tubular member 4472 through the fluid circulator 448, and the cooling fluid passed through the tubular member 4472 flows into the main tank 445 through the fluid circulator 448.

The heat-release fins 4473 are, for instance, plates made of a heat-conductive material such as metals, which are formed so that the tubular member 4472 can be inserted thereto. The plurality of heat-release fins 4473 extend in a direction orthogonal to the insertion direction of the tubular member 4472, the fins 4473 being arranged parallel to each other along the insertion direction of the tubular member 4472. With the above disposition of the plurality of heat-release fins 4473, cooling air sent from the axial flow fan 32 passes between the plurality of heat-release fins 4473 as shown in FIGS. 11A and 11B.

As described above, the cooling fluid circulates, through the plurality of fluid circulators 448, in a flow path from the main tank 445 to the pressure delivery section 446, the branch section 4401, the respective optical modulator holders 4402, the relay tank 4404, the radiator 447 and back to the main tank 445.

[Cooling Mechanism]

Next, cooling mechanism of the liquid crystal panel 441, incident-side polarization plate 442 and irradiation-side polarization plate 443 will be described below.

Figure 12:
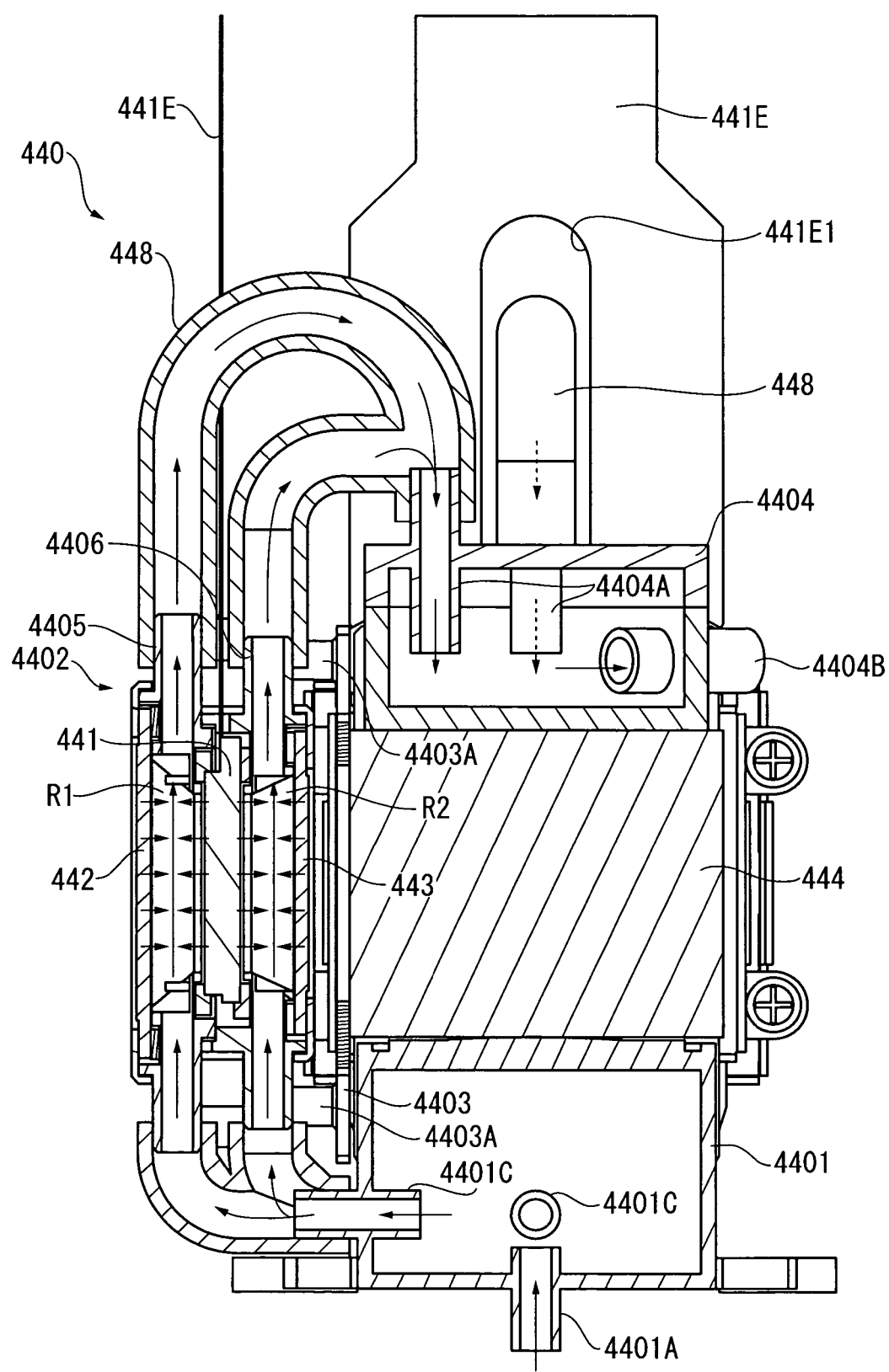
FIG. 12 is a cross section showing how a liquid crystal panel, an incident-side polarization plate and an irradiation-side polarization plate of the aforesaid exemplary embodiment are cooled.

FIG. 12 is a cross section showing a cooling mechanism of the liquid crystal panel 441, the incident-side polarization plate 442, and the irradiation-side polarization plate 443.

By driving the pressure delivery section 446, the cooling fluid in the main tank 445 is introduced into the branch section 4401 through the fluid circulator 448.

The cooling fluid introduced into the branch section 4401 is branched in the respective outflow sections 4401C, and introduced to inside (cooling chambers R1 and R2) of the respective optical modulator holders 4402 through the fluid circulator 448.

The heat generated at the liquid crystal panel 441, the incident-side polarization plate 442, and the irradiation-side polarization plate 443 by the light beam irradiated from the light source device 411 is transferred to the cooling fluid in the respective cooling chambers R1 and R2 of the respective frame members 4405 and 4406 of the optical modulator holder 4402.

The heat transferred to the cooling fluid in the respective cooling chambers R1 and R2 moves from the cooling chambers R1 and R2 to the relay tank 4404 and to the radiator 447 along with the flow of the cooling fluid. When the heated cooling fluid passes through the tubular member 4472 of the radiator 447, the heat of the cooling fluid is transferred from the tubular member 4472 to the plurality of heat-release fins 4473. Then, the heat transferred to the plurality of fins 4473 are cooled by the cooling air sent from the axial flow fan 32.

Then, the cooling fluid cooled in the radiator 447 moves from the radiator 447 to the main tank 445m, the pressure delivery section 446, the branch section 4401, and back to the cooling chambers R1 and R2.

The cooling air introduced from the outside of the projector 1 to the inside thereof by the sirocco fan 31 of the cooling unit 3 is introduced into the optical component casing 45 through the holes 451C provided at the bottom side of the optical component casing 45. The cooling air introduced into the optical component casing 45 is further introduced to the outer side of the optical modulator holder 4402 and between the optical modulator holder 4402 and the support member 4403, flowing from the lower side toward the upper side. The cooling air flows while cooling the light-incident side of the incident-side polarization plate 442 and the light-irradiation side of the irradiation-side polarization plate 443.

In the above described first exemplary embodiment, the flexible printed board 441E constituting the liquid crystal panel 441 is provided with the insertion hole 441E1. Thus, when the liquid crystal panel 441 is incorporated in the optical modulator holder 4402, by inserting the fluid circulator 448 being connected to the outflow port 4405E of the frame member 4405 into the insertion hole 441E1, the respective fluid circulators 448, along with the fluid circulator 448 being connected to the outflow port 4406E, can be extended in a direction toward the light-irradiation side of the optical modulator holder 4402 without necessity of avoiding contact with the flexible printed board 441E.

Herein, since the respective fluid circulators 448 being connected to the respective outflow ports 4405E and 4406E are connected to each other at an end, and the connected end is connected to the inflow section 4404A of the relay tank 4404, connecting operation of the fluid circulator 448 to the respective outflow ports 4405E and 4406E can be performed easily.

Also, since the fluid circulator 448 does not have to be extended so as to avoid contact with the flexible printed board 441E, the reaction force of the fluid circulator 448 being connected to the outflow port 4405E can be reduced, so that position shift of the optical modulator holder 4402 can be restrained. Therefore, mutual positions of the respective crystal panels 441 relative to the cross dichroic prism 444 can be properly maintained, so that the pixel displacement between the respective liquid crystal panels 441 can be restrained.

Since the optical device body 440 includes the relay tank 4404, the respective fluid circulators 448 being connected to the respective outflow ports 4405E and 4406E of the three optical modulator holders 4402 can be collectively relayed. Therefore, when three liquid crystal panels 441 are included, installing operation of the fluid circulator 448 can be performed easily.

Since the relay tank 4404 is attached to the upper side of the cross dichroic prism 444, even when three liquid crystal panels 441 are included, the size of the optical device 44 does not increase. Therefore, usability of the optical device 44 can be improved.

Since the plurality of fluid circulator 448, main tank 445, pressure delivery section 446, branch section 4401, pair of frame members 4405 and 4406, relay tank 4404 and tubular member 4472 are made of aluminum having corrosion resistivity, chemical reaction can be prevented even after contacted with the cooling fluid for a long period of time. In other words, the cooling fluid can be prevented from being colored with reactive substances due to the chemical reaction, so that change in optical property of the light beam passing through the cooling chambers R1 and R2 can be prevented.

[Second Exemplary Embodiment]

Next, a second exemplary embodiment of the present invention will be described with reference to the attached drawings.

In the following description, the same components as those in the first exemplary embodiment are indicated by the same reference symbols or numerals for omitting or simplifying the detailed description thereof.

In the first exemplary embodiment, the optical modulator holder 4402 constituting the optical device body 440 includes the two inflow ports 4405D and 4406D and the two outflow ports 4405E and 4406E. The cooling fluid is introduced into the respective cooling chambers R1 and R2 through the inflow ports 4405D and 4406D, and the cooling fluid in the cooling chambers R1 and R2 is respectively discharged to the outside through the outflow ports 4405E and 4406E.

On the other hand, in the second exemplary embodiment, an optical modulator holder 5402 constituting an optical device body 540 is provided with a pair of cooling chambers R3 and R4, the cooling chambers R3 and R4 being intercommunicated in the optical modulator holder 5402. The optical modulator holder 5402 has one inflow port 5406F and one outflow port 5405F, which introduces the cooling fluid into the respective cooling chambers R3 and R4 through the inflow port 5406F and discharges the cooling fluid flowing in the respective cooling chambers R3 and R4 to the outside through the outflow port 5405F. Components other than the optical device body 540 are the same with the first exemplary embodiment.

Figure 13:
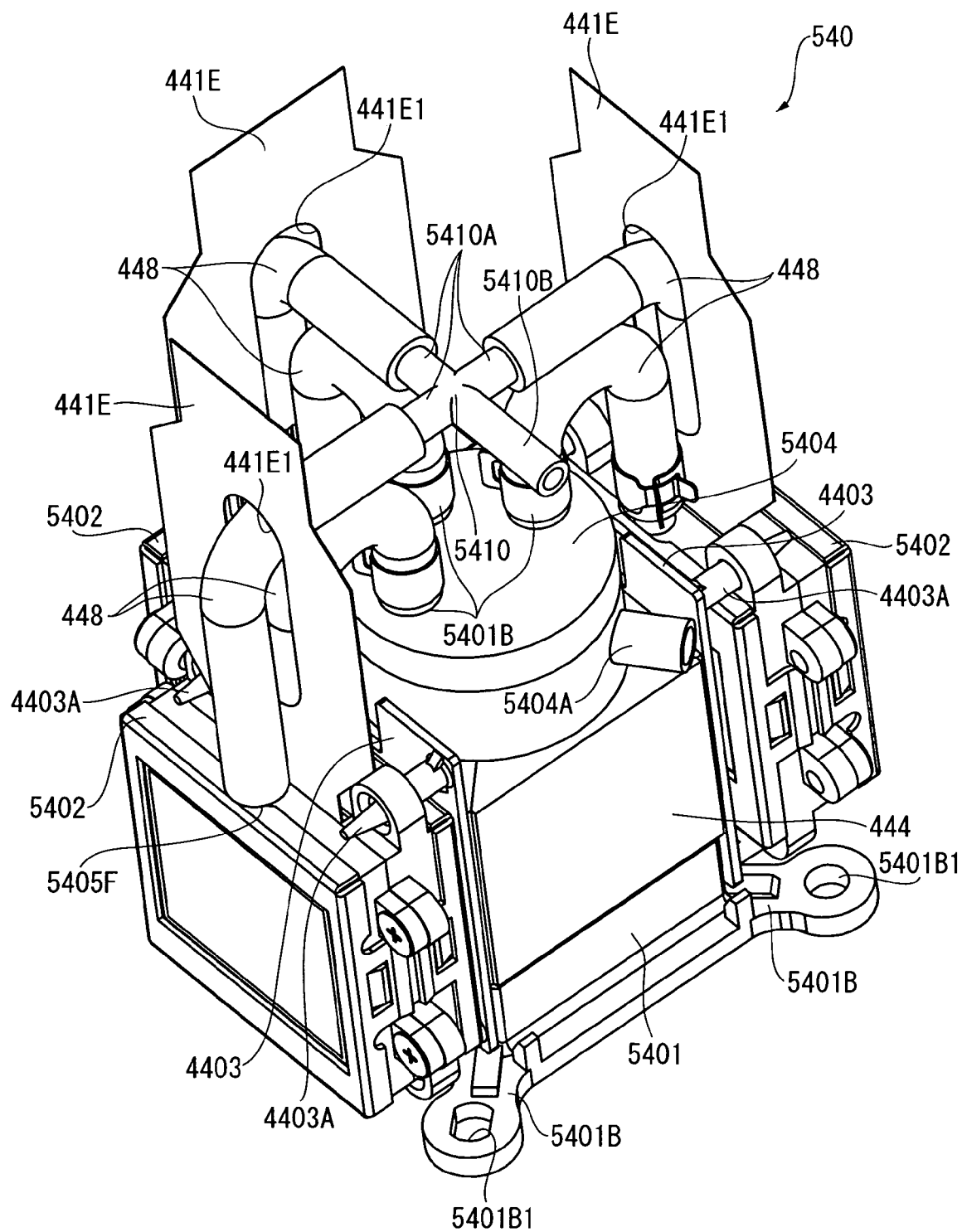
FIG. 13 is a perspective view showing an upper side of an optical device of a second exemplary embodiment.
Figure 14:
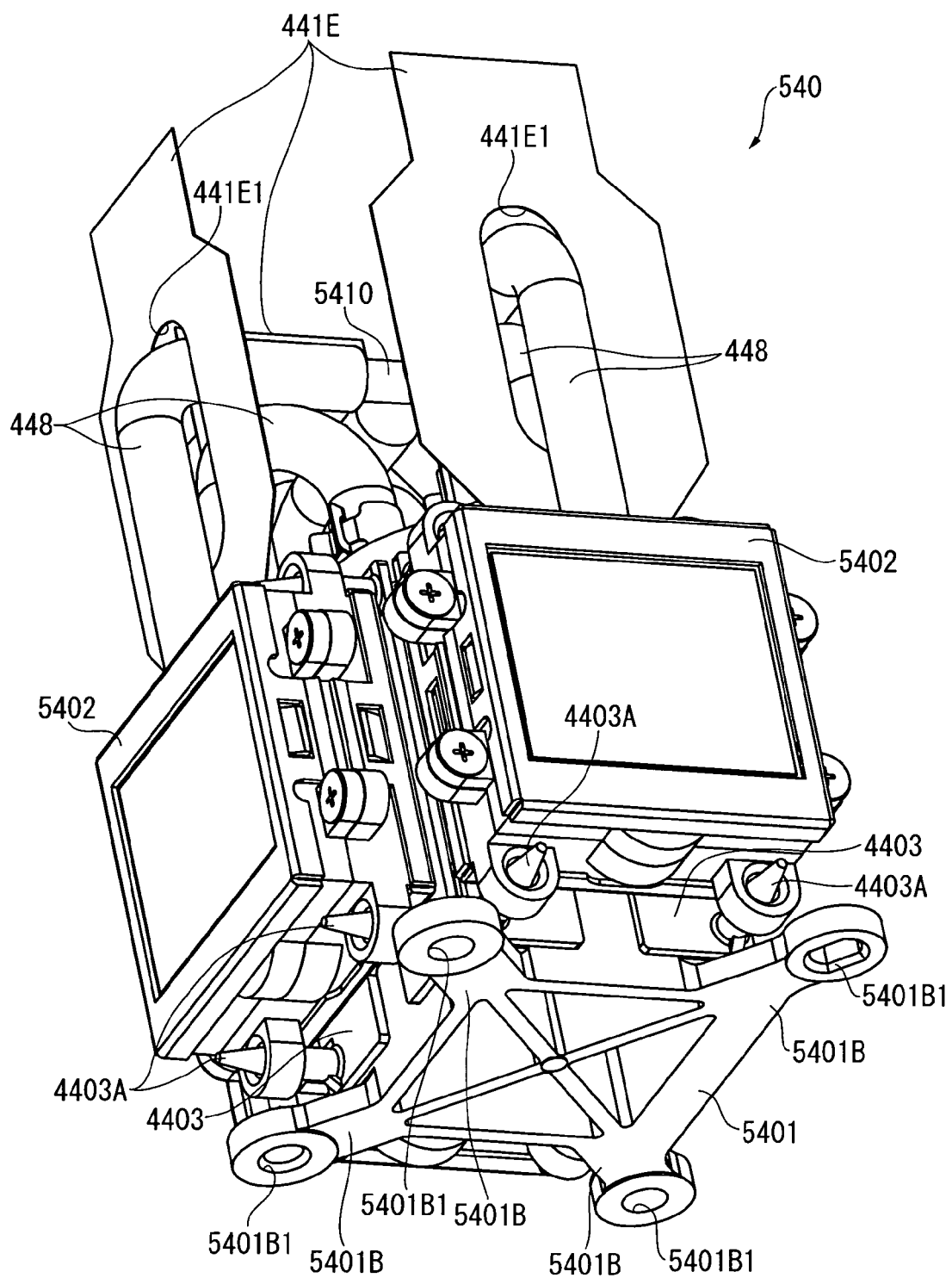
FIG. 14 is a perspective view showing a lower side of the optical device of the aforesaid exemplary embodiment.

Specifically, FIG. 13 is a perspective view showing the upper side of an optical device body 540 of the second exemplary embodiment. FIG. 14 is a perspective view showing a lower side of the optical device body 540.

The optical device body 540 includes a relay tank 5404 (FIG. 13), a prism fixing plate 5401, the three optical modulator holders 5402 and a joint 5410 as a cooling fluid relaying section in addition to the liquid crystal panel 441, incident-side polarization plate 442, irradiation-side polarization plate 443, cross dichroic prism 444 and support member 4403 described in the first exemplary embodiment.

The relay tank 5404 is the same as the relay tank 4404 in the first exemplary embodiment, except that the inflow section 4404A and the outflow section 4404B of the relay tank 4404 function reversely. As shown in FIG. 13, in the relay tank 5404, the outflow section 4404B of the relay tank 4404 functions as a cooling fluid inflow section 5404A for introducing the cooling fluid from the outside. Specifically, although not shown in detail, an outwardly-projecting end of the inflow section 5404A is connected to an end of the fluid circulator 448 being connected to the pressure delivery section 446 (FIG. 2 or 3), so that the cooling fluid delivered from the pressure delivery section 446 is introduced into the relay tank 5404 through the fluid circulator 448.

As shown in FIG. 13, in the relay tank 5404, the three inflow sections 4404A of the relay tank 4404 function as three cooling fluid outflow sections 5404B for branching and discharging the internal cooling fluid to the respective optical modulator holders 5402. As shown in FIG. 13, each of outwardly-projecting ends of the three outflow sections 5404B is respectively connected to an end of each of the three fluid circulators 448, and the other end of each of the fluid circulators 448 is connected to each of later-described inflow ports of the three optical modulator holders 5402, so that the cooling fluid in the relay tank 5404 is branched and discharged to the respective optical modulator holder 5402 through the fluid circulators 448.

The prism fixing plates 5401 has substantially the same shape as the branch section 4401 in the first exemplary embodiment, which only has a function for supporting the cross dichroic prism 444. That is, as shown in FIGS. 13 and 14, the prism fixing plate 5401 does not have the inflow section 4401A and the outflow section 4401C of the branch section 4401 in the first exemplary embodiment, but has arms 5401B (including holes 5401B1) and a not-shown bulged section, each identical with the arms 4401B (including the holes 4401B1) and the bulged section 4401D of the branch section 4401.

FIG. 15 is an exploded perspective view showing the outline of the optical modulator holder 5402.

In substantially the same manner as the optical modulator holder 4402 described in the first exemplary embodiment, the three optical modulator holders 5402 respectively hold the three liquid crystal panels 441, the three incident-side polarization plates 442 and the three irradiation-side polarization plates 443 while respectively cooling the three liquid crystal panels 441, the three incident-side polarization plates 442 and the three irradiation-side polarization plates 443 with the cooling fluid introduced into and discharged from the inside thereof. Each of the optical modulator holders 5402 has the same arrangement, and thus only one of the optical modulator holders 5402 will be described below. As shown in FIG. 15, the optical modulator holder 5402 has a pair of frame members 5405 and 5406, four elastic members 5407 and a middle frame 5409, in addition to the pair of polarization plate fixtures 4408A and 4408B in the first exemplary embodiment.

Figure 16A:
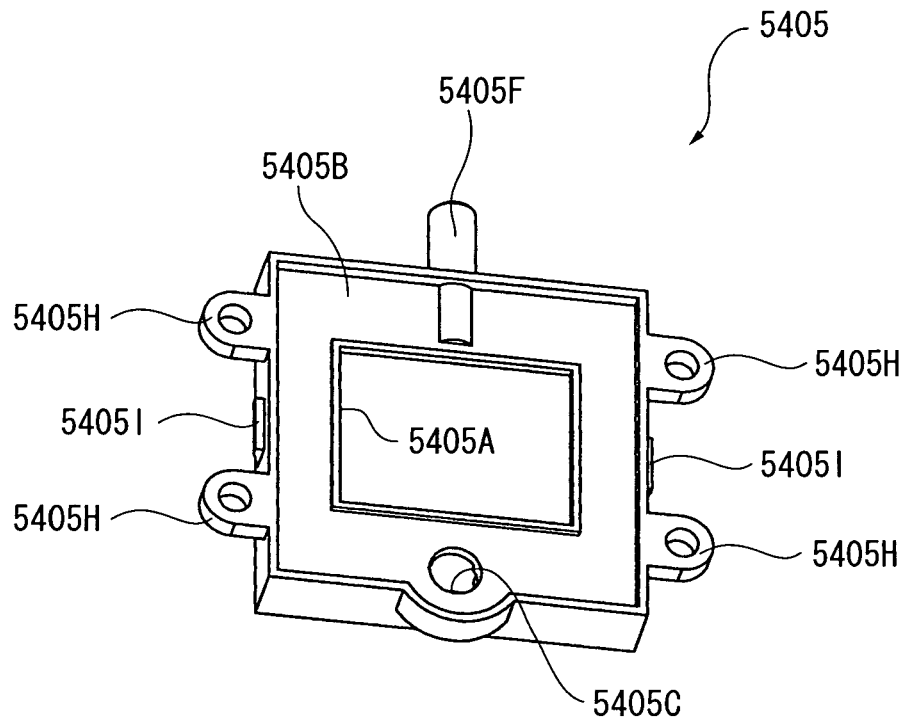
FIG. 16A is a plan view showing the outline of a frame member of the aforesaid exemplary embodiment.
Figure 16B:
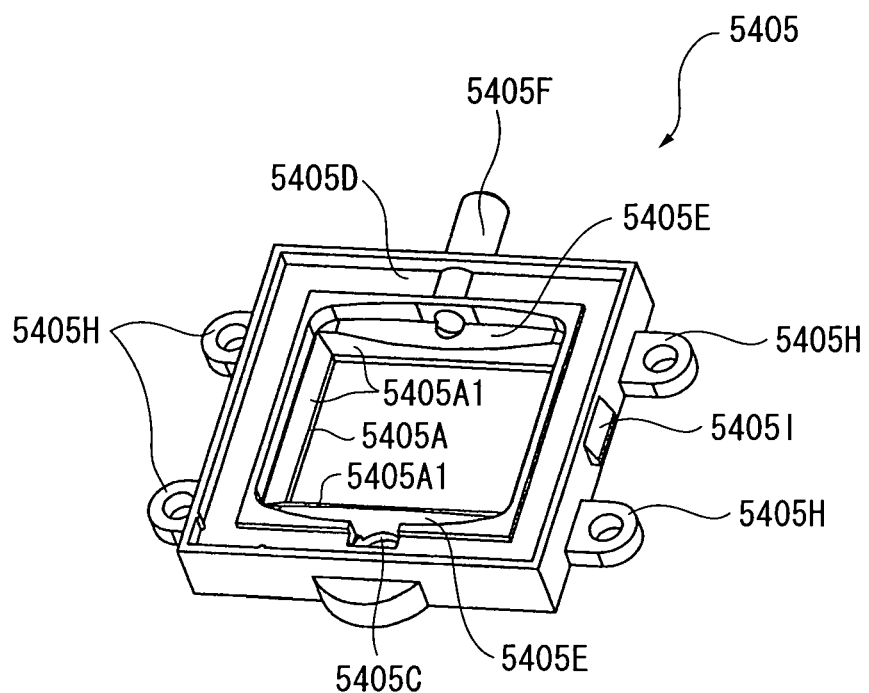
FIG. 16B is a perspective view showing the frame member from the light-incident side.

FIGS. 16A and 16B are illustrations each showing the outline of the frame member 5405. Specifically, FIG. 16A is a perspective view showing the frame member 5405 from the light-irradiation side. FIG. 16B is a perspective view showing the frame member 5405 from the light-incident side.

The frame member 5405 is made of aluminum, and is disposed on the light-incident side relative to the frame member 5406 to support the light-incident side of the liquid crystal panel 441 while supporting the light-irradiation side of the incident-side polarization plate 442. The detailed arrangement is substantially the same as the shape of the frame member 4405 described in the first exemplary embodiment. Specifically, the frame member 5405 includes an opening 5405A (including inclined sides 5405A1), connecting sections 5405H and hooks 5405I substantially identical with the opening 4405A (including the inclined sides 4405A1), the connecting sections 4405H and the hooks 4405I of the frame member 4405.

As shown in FIG. 16A, in the frame member 5405, a cavity 5405B having a shape corresponding to the shape of the second elastic member 4407B of the elastic members 5407 is formed on the light-irradiation side, so that the incident side of the liquid crystal panel 441 is supported by the cavity 5405B with the second elastic member 4407B and the middle frame 5409 interposed therebetween. Since the frame member 5405 supports the light-incident side of the liquid crystal panel 441, the light-irradiation side of the opening 5405A is closed with the second elastic member 4407B, the middle frame 5409 and the light-incident side of the liquid crystal panel 441.

As shown in FIG. 16A or 16B, an insertion hole 5405C penetrating through the light-incident side and the light-irradiation side for a later-described cylindrical section of the frame member 5406 to be inserted thereto is formed substantially at the horizontal center of the lower side in the cavity 5405B.

As shown in FIG. 16B, in the frame member 5405, a cavity 5405D having a rectangular frame shape corresponding to the shape of a first elastic member 4407A of the elastic members 5407 is formed at the light-incident side, so that the incident-side polarization plate 442 is supported by the cavity 5405D with the first elastic member 4407 interposed therebetween. By fixing the polarization plate fixture 4408A to the frame member 5405, the incident-side polarization plate 442 is pressed to the cavity 5405D of the frame member 5405 with the first elastic member 4407A interposed therebetween, so that the light-incident side of the opening 5405A of the frame member 5405 is closed.

As shown in FIG. 16B, cavities 5405E having greater depth than the cavity 5405D are respectively formed on upper and lower side peripheries of the opening 5405A on the light-incident side.

In the cavities 5405E, the upper cavity 5405E is curved with the horizontal center dented toward the light-irradiation side. An upper wall of the cavity 5405E is curved with curved with the horizontal center dented upwardly.

Also, a lower wall of the lower cavity 5405E is similarly curved with curved with the horizontal center dented downwardly, the horizontal center being connected to the insertion hole 5405C.

When the light-incident side and the light-irradiation side of the opening 5405A are closed with the liquid crystal panel 441 and the incident-side polarization plate 442 as described above, the cooling chamber R3 (FIG. 19) is formed in the frame member 5405 (in the opening 5405A and in a gap between the cavity 5405E and the incident-side polarization plate 442) so that the cooling fluid can be sealed therein.

As shown in FIGS. 16A and 16B, an outflow port 5405F penetrating through the upper wall of the upper cavity 5405E and having a same shape with the outflow port 4405E in the first exemplary embodiment is formed substantially at the center of the upper side of the frame member 5405. As shown in FIG. 13, an end of the outflow port 5405F projecting toward the outside of the frame member 5405 is connected to an end of the fluid circulator 448, so that the internal cooling fluid (in the cooling chamber R3) is discharged to the outside through the fluid circulator 448.

Figure 17A:
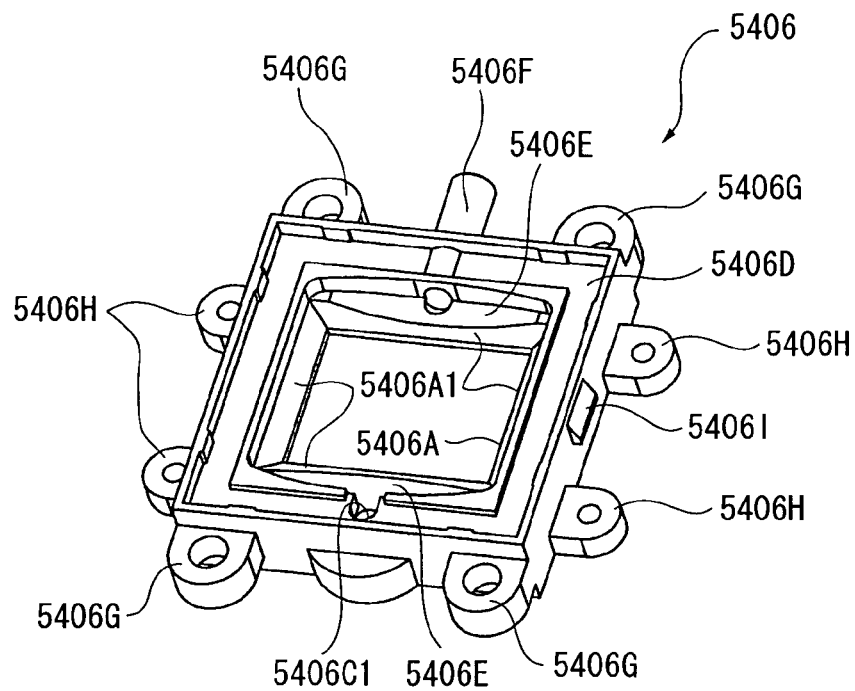
FIG. 17A is an illustration showing the outline of the frame member of the aforesaid exemplary embodiment.
Figure 17B:
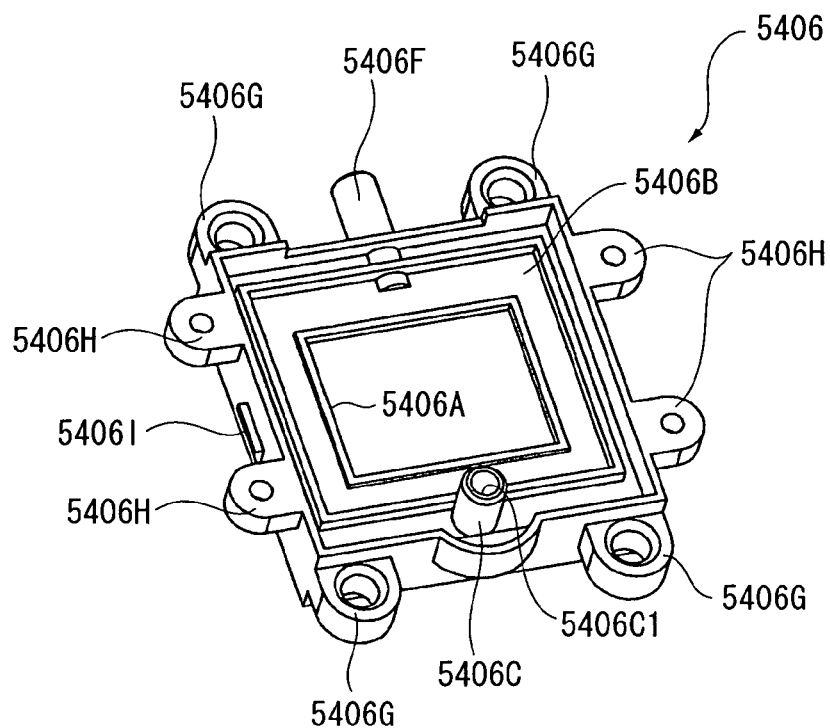
FIG. 17B is a perspective view showing the frame member from the light-incident side.

FIGS. 17A and 17B are illustrations each showing the outline of the frame member 5406. Specifically, FIG. 17A is a perspective view showing the frame member 5406 from the light-irradiation side. FIG. 17B is a perspective view showing the frame member 5406 from the light-incident side.

The frame member 5406 is made of aluminum, which is connected to the above-described frame member 5405 with screws 5406J (FIG. 15) to sandwich the liquid crystal panel 441 with the above-described frame member 5405 interposing the elastic member 5407 and the middle frame 5409, while supporting the light-irradiation polarization plate 443 the elastic member 5407 interposed therebetween at a side opposite to an opposing side of the frame member 5405. The detailed arrangement of the frame member 5406 is substantially same with the frame member 4406 described in the first exemplary embodiment. In other words, the frame member 5406 includes an opening 5406A (including inclined sides 5406A1), connecting sections 5406H and hooks 5406I substantially identical with the opening 4406A (including not-shown inclined sides), the connecting sections 4406H and the hooks 4406I of the frame member 4406.

The light-irradiation side of the frame member 5406 has substantially the same shape as the light-irradiation side of the frame member 5405, which has cavities 5406D and 5406E substantially identical with the cavities 5405D and 5405E of the frame member 5405 as shown in FIG. 17A.

By fixing the polarization plate fixture 4408B to the frame member 5406, the irradiation-side polarization plate 443 is pressed to the cavity 5406D with the fourth elastic member 4407D of the elastic members 5407 interposed therebetween, so that the light-irradiation side of the opening 5406A of the frame member 5406 is closed.

As shown in FIGS. 17A and 17B, a cylindrical section 5406C projecting substantially orthogonally from the light-incident side is formed substantially at the horizontal center of the lower cavity 5406D of the cavities 5406D and 5406E, the cylindrical section 5406C having a hole 5406C1 corresponding to the insertion hole 5405C of the frame member 5405 and penetrating the light-irradiation side and the light-incident side.

As shown in FIG. 17A, substantially the horizontal center of the lower wall of the lower cavity 5406E is connected to the hole 5406C1 of the cylindrical section 5406C.

When the frame members 5406 and 5405 are combined, the cylindrical section 5406C of the frame member 5406 is inserted into the insertion hole 5405C of the frame member 5405, so that the cooling fluid can flow in the light-irradiation side of the frame member 5406 and the light-incident side of the frame member 5405 through the hole 5406C1 of the cylindrical section 5406C and the insertion hole 5405C.

The inner diameter of the cylindrical section 5406C should preferably be in the range from 1 mm to 5 mm, and more preferably, from 2 mm to 3 mm.

The cylindrical section 5406C and an insertion hole 5405C corresponds to a communication hole of the present invention.

As shown in FIG. 17B, a cavity 5406B having a rectangular frame shape corresponding to the shape of a later-described third elastic member of the elastic members 5407 is formed on the light-incident side of the frame member, so that the light-irradiation side of the liquid crystal panel 441 is supported by the cavity 5406B with the third elastic member interposed therebetween. Since the frame member 5406 supports the irradiation side of the liquid crystal panel 441, the light-incident side of the opening 5406A is closed with the third elastic member and the light-irradiation side of the liquid crystal panel 441.

When the light-incident side and the light-irradiation side of the opening 5406A are closed with the liquid crystal panel 441 and the irradiation-side polarization plate 443 as described above, the cooling chamber R4 (FIG. 19) allowing the cooling fluid to be sealed in the frame member 5406 (in the opening 5406A and in a gap between the cavity 5406E and the irradiation-side polarization plate 443) is formed.

As shown in FIGS. 17A and 17B, in the frame member 5406, an inflow port 5406F penetrating through the upper wall of the upper cavity 5406E and having the same shape as the inflow port 4405D in the first exemplary embodiment is formed substantially at the center of the upper side. As shown in FIG. 13, in the inflow port 5406F, an end projecting outwardly toward the outside of the frame member 5406 is connected to an end of the fluid circulator 448 being connected to the outflow section 5404B of the relay tank 5404, so that the cooling fluid in the relay tank 5404 is introduced to the inside (in the cooling chamber R4) through the fluid circulator 448.

In the present exemplary embodiment, inner sectional areas of the inflow port 5406F and the outflow port 5405F are set to be substantially identical with the inner sectional area of the cylindrical section 5406C. With such arrangement, resistance of the flow path for the cooling fluid can be substantially uniformed in the optical modulator holder 5402, so that convective velocity of the cooling fluid can be increased.

The inner sectional areas of the inflow port 5406F and outflow port 5405F may not be substantially identical with the inner sectional area of the cylindrical section 5406C, but the sectional area may be differently designed.

As shown in FIGS. 17A and 17B, four insertions 5406G for the pins 4403A of the support members 4403 to be inserted are formed at upper corners and lower corners of the frame member 5406.

The four elastic members 5407 include a second elastic member 5407B in addition to the first elastic member 4407A, the third elastic member 4407C and the fourth elastic member 4407D described in the first exemplary embodiment. As a material of the elastic members, silicone rubber or butyl rubber, fluorocarbon rubber or the like having low moisture permeability may be employed as with the elastic members 4407 described in the first exemplary embodiment.

As shown in FIG. 15, the second elastic member 5407B is a substantially rectangular frame shape with an insertion hole 5407B1 for the cylindrical section 5406C (FIG. 17B) to be inserted thereto substantially at the horizontal center of the lower side. The second elastic member 5407B is set in the cavity 5405B of the frame member 5405.

The elastic members 5407 seal the respective cooling chambers R3 and R4 (FIG. 19) of the frame members 5405 and 5406 and prevents the cooling fluid from leaking toward the liquid crystal panel 441 from a connecting part of the cylindrical section 5406C and the insertion hole 5405C.

The middle frame 5409 is an aluminum plate having a substantially rectangular shape in plan view, which holds the liquid crystal panel 441 while positioning the liquid crystal panel 441 at predetermined positions on the frame members 5405 and 5406.

As shown in FIG. 15, in the middle frame 5409, a rectangular opening 5409A for the opposing board 441D of the liquid crystal panel 441 to be fitted is formed substantially at the center thereof. By fitting the opposing board 441D of the liquid crystal panel 441 in the opening 5409A, the liquid crystal panel 441 can be positioned relative to the middle frame 5409.

At the periphery of the opening 5409A, step 5409B is formed for the driving board 441C to be disposed in a loosely-fitted manner when the opposing board 441D is fitted in the opening 5409A. A space between the step 5409B and the light-incident side of the middle frame 5409 is smaller than the thickness of the opposing board 441D, so that a gap 5409C (FIG. 19) is formed between the step 5409B and the driving board 441C when the opposing board 441D is fit in the opening 5409A so that the light-incident side of the opposing board 441D is substantially flush with the light-incident side of the middle frame 5409. By filling the gap 5409C (FIG. 19) with an adhesive having high elongation ratio, the liquid crystal panel 441 is positioned and fixed to the middle frame 5409.

The upper side of the step 5409B extends over the upper side of the middle frame 5409, so that the liquid crystal panel 441 can be disposed without bending the flexible printed board 441E of the liquid crystal panel 441 when the liquid crystal panel 441 is positioned and fixed to the middle frame 5409.

As shown in FIG. 15, in the middle frame 5409, an insertion hole 5409D for the cylindrical section 5406C (FIG. 17B) of the frame member 5406 to be inserted thereto is formed substantially at the horizontal center. The insertion hole 5409D functions as a positioning hole for the middle frame 5409 relative to the frame member 5406. By inserting the cylindrical section 5406C of the frame member 5406 into the insertion hole 5409D of the middle frame 5409 with the liquid crystal panel 441 having been positioned to the middle frame 5409 in advance, the middle frame 5409 is positioned relative to the frame member 5406, in other words, the liquid crystal panel 441 is positioned at a predetermined position of the frame member 5406.

As shown in FIG. 13, the joint 5410 is an aluminum tubular member having a substantially cross shape in plan view, which includes three inflow ports 5410A and an outflow port 5410B, and collectively discharging the cooling fluid discharged from each of the optical modulator holders 5402 to the radiator 447.

As shown in FIG. 13, the joint 5410 is disposed the upper side of the relay tank 5404, and the three inflow ports 5410A are respectively connected to the ends of the respective fluid circulators 448 being connected to the respective outflow ports 5405F of the three optical modulators 5402 with the state being inserted into the respective insertion holes 441E1 of the flexible printed boards 441E of the respective liquid crystal panels 441. The outflow port 5410B is connected to an end of the fluid circulator being connected to an upper end of the tubular member 4472 (FIGS. 1A and 1B) of the radiator 447, so that the cooling fluid introduced from the three inflow ports 5410A through the fluid circulator is collectively sent to the radiator 447.

As described above, in substantially the same manner as the first exemplary embodiment, the cooling fluid circulates through the plurality of fluid circulators 448 in a flow path from the main tank 445 (FIGS. 5A and 5B) to the pressure delivery section 446 (FIG. 3), the relay tank 5404 (FIG. 13), the respective optical modulator holders 5402 (FIG. 14), the joint 5410 (FIG. 13), the radiator 447 (FIGS. 11A and 11B) and back to the main tank 445 (FIGS. 5A and 5B).

Next, cooling mechanism of the liquid crystal panel 441, the incident-side polarization plate 442 and the irradiation-side polarization plate 443 will be described below.

Figure 18:
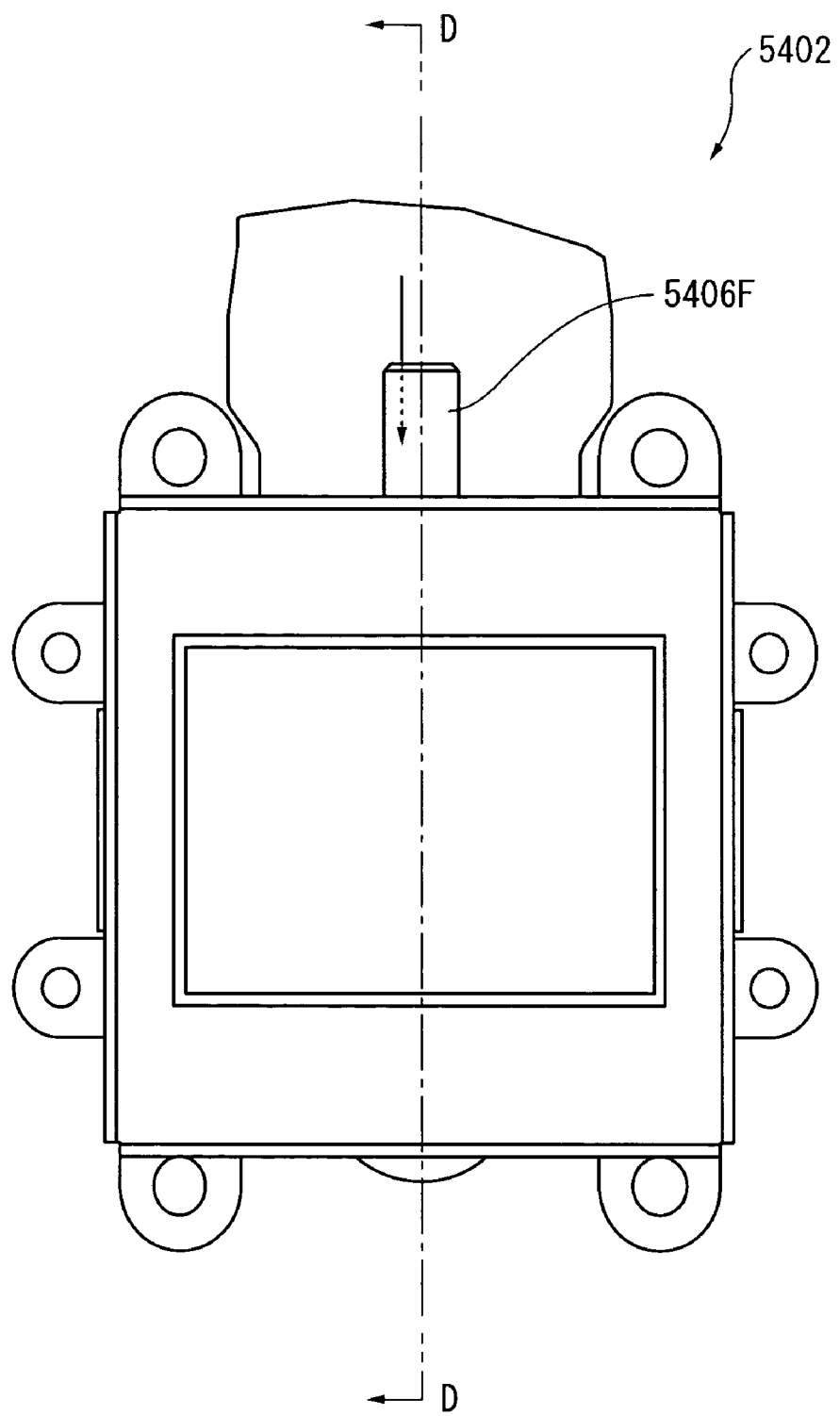
FIG. 18 is an illustration showing how a liquid crystal panel, an incident-side polarization plate and an irradiation-side polarization plate of the aforesaid exemplary embodiment are cooled.
Figure 19:
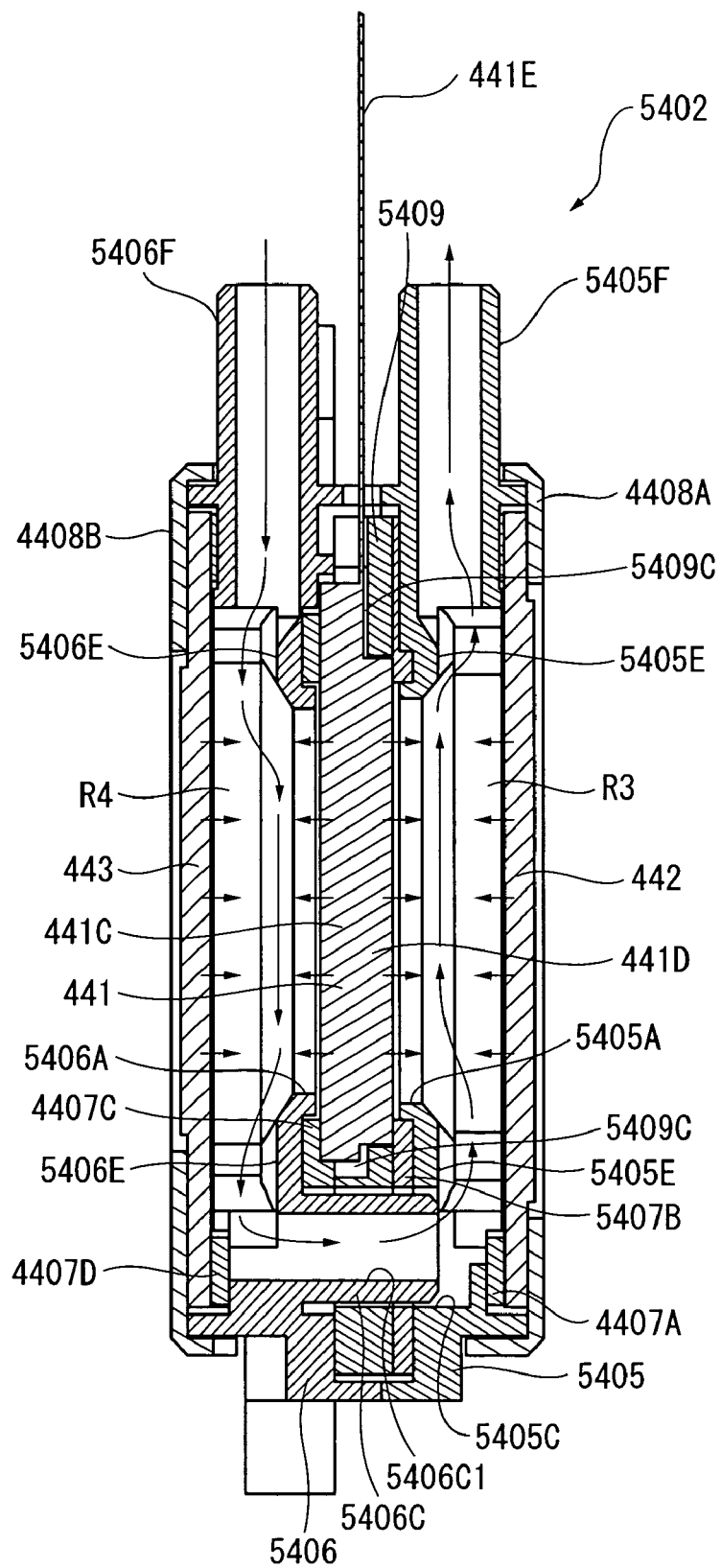
FIG. 19 is an illustration showing how the liquid crystal panel, incident-side polarization plate and irradiation-side polarization plate of the aforesaid exemplary embodiment are cooled.

FIGS. 18 and 19 are illustrations showing a cooling mechanism of the liquid crystal panel 441, the incident-side polarization plate 442 and the irradiation-side polarization plate 443. Specifically, FIG. 18A is a plan view showing the optical modulator holder 5402 from the light-irradiation side. FIG. 19 is a cross section taken along line D—D in FIG. 18.

By driving the pressure delivery section 446, the cooling fluid in the main tank 445 is sent into the relay tank 5404 through the fluid circulator 448.

Then, the cooling fluid sent into the relay tank 5404 is discharged from the respective outflow sections 5404B of the relay tank 5404, and introduced into the respective cooling chambers R4 (FIG. 19) of the respective optical modulator holders 5402 from the respective inflow ports 5406F of the three optical modulator holders 5402, as shown in FIGS. 18 and 19.

The heat generated on the driving board 441C of the liquid crystal panel 441, and the irradiation-side polarization plate 443 by the light beam irradiated from the light source device 411 is transferred to the cooling fluid in the cooling chambers R4.

As shown in FIG. 19, the heat transferred to the cooling fluid in the cooling chamber R4 is moved downwardly in FIG. 19 along with flow of the cooling fluid. The heat transferred downwardly is then guided substantially to the horizontal center by the wall of the lower cavity 5406E (FIG. 17A) in the frame member 5406 along with flow of the cooling fluid. As shown in FIG. 19, the heat guided substantially to the horizontal center transfers into the cooling chamber R3 through the cylindrical section 5406C and the insertion hole 5405C being connected to the cylindrical section 5406C, The heat generated at the opposing board 441D of the liquid crystal panel 441 and the incident-side polarization plate 442 by the light beam irradiated from the light source device 411 is transferred to the cooling fluid in the cooling chamber R3.

As shown in FIG. 19, the heat transferred to the cooling fluid in the cooling chamber R3 together with the heat transferred from the cooling chamber R4 is transferred upwardly in FIG. 19 along with flow of the cooling fluid. The heat transferred upwardly is then guided substantially to the horizontal center by the wall of the upper cavity 5405E (FIG. 16B) in the frame member 5405 along with flow of the cooling fluid. As shown in FIG. 19, the heat guided substantially to the center is then transferred to the outside from the outflow port 5405F along with the flow of the cooling fluid.

The heat transferred to the outside of the optical modulator holder 5402 through the outflow port 5405F is transferred from the optical modulator holder 5402 to the joint 5410 and to the radiator 447 through the fluid circulator 448, so that the heat is released at the radiator 447 in the same manner as the first exemplary embodiment.

Then, the cooling fluid cooled at the radiator 447 moves from the radiator 447 to the main tank 445, the pressure delivery section 446, the relay tank 5404 and back to the cooling chamber R4.

As with the first exemplary embodiment, the cooling air flows along the outer side of the optical modulator holder 5402 and into between the optical modulator holder 5402 and the support member 4403 by the sirocco fan 31 of the cooling unit 3 to cool the light-incident side of the incident-side polarization plate 442 and the light-irradiation side of the irradiation-side polarization plate 443.

In the above described second exemplary embodiment, as compared with the first exemplary embodiment, when the liquid crystal panel 441 is assembled in the optical modulator holder 5402, by inserting the fluid circulator 448 being connected to the outflow port 5405F of the frame member 5405 into the insertion hole 441E1, the respective fluid circulators 448, along with the fluid circulator 448 being connected to the inflow port 5406F, can be extended in a direction toward the light-irradiation side of the optical modulator holder 5402 without necessity of avoiding contact with the flexible printed board 441E.

Since the inflow port 5406F and the outflow port 5405F of the optical modulator holder 5402 are respectively formed on the upper sides of the respective frame members 5406 and 5405, connecting operation of the fluid circulators 448 to the optical modulator holder 5402 can be performed in a single direction (from above), so that connecting operation of the fluid circulator 448 in the optical modulator holder 5402 can be performed easily.

Further, since the relay tank 5404 is attached to the upper side of the cross dichroic prism 444, connecting operation of the fluid circulator 448 to the relay tank 5404 can also be performed in a single direction (from above), so that the connecting operation of the fluid circulator 448 in the optical device body 540 can be further facilitated.

Further, since the joint 5410 is attached to the upper side of the relay tank 5404, connecting operation of the fluid circulator 448 being connected to the respective outflow ports 5405F of the optical modulator holder 5402 can also be performed in a single direction (from above), so that the connecting operation of the fluid circulator 448 in the optical device body 540 can be further facilitated.

By forming the insertion hole 5405C and the cylindrical section 5406C in the pair of frame members 5405 and 5406, two inflow ports 5406F and outflow ports 5405F are not necessary on the respective cooling chambers R3 and R4, but an arrangement providing only one inflow port 5406F and outflow port 5405F to the optical modulator holder 5402 may be employed.

Therefore, connecting operation of the fluid circulator 448 to the inflow port 5406F and the outflow port 5405F can be performed easily. In addition, by reducing the number of connecting parts, the number of parts causing leakage of the cooling fluid can also be reduced. Further, utilization efficiency of a space around the optical modulator holder 5402 can be enhanced. Still further, the reaction force of the fluid circulator 448 relative to the optical modulator holder 5402 can further be reduced when the fluid circulator 448 is connected to the optical modulator holder 5402, so that mutual positions of the respective liquid crystal panels 441 relative to the cross dichroic prism 444 can be maintained even more properly, and the pixel displacement between the respective liquid crystal panels 441 can further be restrained.

While the present invention has been described above with the preferable exemplary embodiments, the present invention is not limited to the above-described exemplary embodiments, but includes improvements and modifications as long as an object of the present invention can be achieved.

In the respective exemplary embodiments, the inflow ports 4405D, 4406D and 5406F and the outflow ports 4405E, 4406E and 5405F may not be formed at the positions described in the respective exemplary embodiments, but may be formed on the other positions.

For instance, in the first exemplary embodiment, the inflow ports 4405D and 4406D are respectively formed on the lower sides of the frame members 4405 and 4406, and the outflow ports 4405E and 4406E are respectively formed on the upper sides of the frame members 4405 and 4406, but the arrangement is not limited thereto. Specifically, convection direction of the cooling fluid may be reversed, so that the inflow ports 4405D and 4406D function as outflow ports, and outflow ports 4405E and 4406E function as inflow ports. In the above arrangement, the relay tank 4404 and the pressure delivery section 446 are connected by the fluid circulator 448. With such arrangement, the cooling fluid delivered from the pressure delivery section 446 is sent into the relay tank 4404, and branched at the relay tank 4404 for each of the three optical modulator holders 4402 to be sent.

In the first exemplary embodiment, the cooling chambers R1 and R2 are respectively formed in both of the frame members 4405 and 4406 (i.e. on both of the light-incident side and the light-irradiation side of the liquid crystal panel 441), but the arrangement is not limited thereto. Only one cooling chamber may also be employed, where, for instance, a cooling chamber formed only in the frame member 4405 (i.e. only at the light-incident side of the liquid crystal panel 441) may be provided.

Though the inflow port 5406F is formed at the upper side of the frame member 5406, while the outflow port 5405F is formed at the upper side of the frame member 5405 in the second exemplary embodiment, the arrangement is not limited thereto. Specifically, convection direction of the cooling fluid may be reversed, so that the inflow port 5406F functions as an outflow port, and an outflow port 5405F functions as an inflow port. In the above arrangement, the joint 5410 and the pressure delivery section 446 are connected by the fluid circulator 448. With such arrangement, the cooling fluid delivered from the pressure delivery section 446 is branched at the joint 5410 for each of the three optical modulator holders 5402 to be sent.

In the first exemplary embodiment, though the relay tank 4404 is used as the cooling fluid relaying section for collectively introducing the cooling fluid discharged from the respective optical modulator holders 4402, the arrangement is not limited thereto, but the joint 5410 described in the second exemplary embodiment may also be employed as the cooling fluid relaying section.

In the second exemplary embodiment, the position or number of the communication hole formed on the pair of frame members 5405 and 5406 are not limited. In other words, the communication hole can be formed on positions other than the substantially horizontal center, and the number of the communication hole may not be one but may be two or more.

In the respective exemplary embodiment, at least one of the main tank 445, the pressure delivery section 446 and the radiator 447 constituting the optical device 44 may be omitted for achieving the object of the present invention.

In the respective exemplary embodiments, though the pair of frame members 4405 and 4406 and the pair of frame members 5405 and 5406 of the optical modulator holders 4402 and 5402 have the incident-side polarization plates 442 and the irradiation-side polarization plates 443 at the light-incident side and the light-irradiation side, but the arrangement is not limited thereto. For instance, a transmissive board such as glass without a polarization film attached thereto may disposed on the light-incident side and the light-irradiation side of the pair of frame members 4405 and 4406 and the pair of frame members 5405 and 5406. In the above arrangement, as the incident-side polarization plate and irradiation-side polarization plate, by providing a reflection-type polarization plate transmitting a light beam having a predetermined polarization axis and reflecting a light beam having other polarization axis instead of an absorption-type polarization plate described in the respective exemplary embodiments, temperature rise due to the light beam irradiated from the light source can be restrained without cooling the incident-side polarization plate and the irradiation-side polarization plate by the cooling fluid.

In the respective exemplary embodiments, the fluid circulator 448, the main tank 445, the pressure delivery section 446, the tubular member 4472 of the radiator 447, the frame members 4405, 4406, 5405 and 5406, the relay tanks 4404 and 5404 and joint 5410 being members contacting the cooling fluid is an aluminum material, but the arrangement is not limited thereto. Without limiting to aluminum, any other materials having corrosion resistivity such as oxygen-free copper or duralumin may also be employed. As the fluid circulator 448, butyl rubber or fluorocarbon rubber having low hardness and capable of restraining the pixel displacement with small deformation reaction force to the optical modulator holders 4402 and 5402 may also be employed.

In the respective exemplary embodiments, flow volume of the cooling fluid introduced into the respective optical modulator holders 4402 and 5402 are set to be substantially uniformed, but the arrangement is not limited thereto, but different flow volume may be employed for the cooling fluid introduced into the respective optical modulator holders 4402 and 5402.

For instance, a valve may be provided in the flow path flowing from the branch section 4401 or the relay tank 5404 to the respective optical modulator holders 4402 or the respective optical modulator holders 5402 so that the flow path can be widened or narrowed by changing the attitude of the valve.

Further, for instance, tube diameter of the respective fluid circulators 448 connecting the branch section 4401 or the relay tank 5404 and the respective optical modulator holder 4402 and 5402 may be different.

In the respective exemplary embodiments, the outer sides of the optical modulator holders 4402 and 5402 and the bottom side of the optical component casing 45 are cooled with the air sent from the sirocco fan 31, but the sirocco fan 31 may not be provided. With such arrangement, noise can be minimized.

In the respective exemplary embodiments, an arrangement having the optical unit 4 having a substantially L-shape in plan view is exemplified, but for instance, an arrangement having a substantially C-shape in plan view may also be employed.

In the respective exemplary embodiments, only an example of a projector 1 having three liquid crystal panels 441 is exemplified. However, the present invention can also be applied to a projector having only one liquid crystal panel, two liquid crystal panels or four or more liquid crystal panels.

In the respective exemplary embodiments, the transmissive-type liquid crystal panel having different light-incident side and light-irradiation side is employed. However, the reflection-type liquid crystal panel having the same light-incident side and irradiation side may also be employed.

In the respective exemplary embodiments, only a front-type projector that projects an image in a direction for observing a screen is exemplified, but the present invention may also be applied to a rear-type projector that projects an image in a direction opposite to the direction for observing the screen.

Although the best mode for implementing the present invention has been disclosed above, the present invention is not limited thereto. In other words, while the present invention is mainly illustrated and described on the specific exemplary embodiments, a person skilled in the art can modify the specific arrangement such as shape, material, quantity in the above-described exemplary embodiments as long as a technical idea and an object of the present invention can be achieved.

Therefore, the description limiting the shapes and the materials disclosed above is intended to be illustrative for easier understanding and not to limit the invention, hence the present invention includes the description using a name of component without a part of or all of the limitation on the shape and the material etc.

The priority application No. JP2004-038332 upon which this patent application is based is hereby incorporated by reference.

What is claimed is:

1. An optical modulator that modulates a light beam irradiated from a light source in accordance with image information to form an optical image, comprising:
   a driving board having a plurality of signal lines, a plurality of switching elements connected to the plurality of signal lines and a plurality of picture electrodes connected to the plurality of switching elements;
   an opposing board being opposed to the driving board and having common electrodes;
   a liquid crystal sealed between the driving board and the opposing board; and
   a circuit board electrically connected to the plurality of signal lines and the common electrodes and extending from between the driving board and the opposing board,
   the circuit board being provided with an insertion hole for a fluid circulator in which a cooling fluid is circulated to be inserted.

2. An optical device comprising:
   an optical modulator that modulates a light beam irradiated from a light source in accordance with image information to form an optical image;
   an optical modulator holder that has a cooling chamber in which the cooling fluid is sealed therein, the optical modulator holder holding the optical modulator so that heat can be transferred to the cooling fluid in the cooling chamber; and
   a plurality of fluid circulators intercommunicated and connected to the cooling chamber of the optical modulator holder to guide the cooling fluid to the outside of the cooling chamber and to re-introduce the cooling fluid into the cooling chamber, wherein the optical modulator includes: a driving board having a plurality of signal lines, a plurality of switching elements connected to the plurality of signal lines and a plurality of picture electrodes connected to the plurality of switching elements; an opposing board being opposed to the driving board and having common electrodes; a liquid crystal sealed between the driving board and the opposing board; and a circuit board electrically connected to the plurality of signal lines and the common electrodes and extending from between the driving board and the opposing board, the circuit board being provided with an insertion hole for a fluid circulator in which a cooling fluid is circulated to be inserted, and the optical modulator holder has an inflow port for introducing the cooling fluid from the outside into the cooling chamber and/or an outflow port for discharging the cooling fluid in the cooling chamber to the outside, the inflow port and/or the outflow port being formed at a side corresponding to a position of the circuit board when the optical modulator is held; and the fluid circulator connected to the inflow port and/or the outflow port out of the plurality of fluid circulators is inserted into the insertion hole of the circuit board.

3. The optical device according to claim 2, wherein the optical modulator holder includes a pair of frame members that respectively have an opening in accordance with an image formation area of the optical modulator and sandwich the optical modulator, and transmissive boards that are respectively disposed on sides opposite to opposing sides of the pair of frame members;

the cooling chambers are respectively formed in both of the pair of frame members by respectively closing the opposing sides and the sides opposite to the opposing sides of the opening of the pair of frame members with the optical modulator and the transmissive board; and one of the inflow port and the outflow port is formed respectively on first side of the pair of frame members corresponding to a position of the circuit board when the optical modulator is held, and the other one of the inflow port and the outflow port is formed respectively on an opposing second side of the first side.

4. The optical device according to claim 2, wherein the optical modulator holder includes a pair of frame members that respectively have an opening in accordance with an image formation area of the optical modulator and sandwich the optical modulator, and transmissive boards that are respectively disposed on opposite side to opposing sides of the pair of frame members;

the cooling chambers are respectively formed in both of the pair of frame members by respectively closing the opposing sides and the sides opposite to the opposing sides of the opening of the pair of frame members with the optical modulator and the transmissive board;

the pair of frame members are provided with a communication hole intercommunicating the respective cooling chambers;

the inflow port is formed on a side corresponding to the position of the circuit board when the optical modulator is held in one frame member of the pair of frame members; and the outflow port is formed on a side corresponding to the position of the circuit board when the optical modulator is held in the other frame member of the pair of frame members.

5. The optical device according to claim 2, comprising:

the optical modulator including a plurality of optical modulator;

the optical modulator holder including a plurality of optical modulator holder in accordance with the plurality of optical modulators;

a color-combining optical device having a plurality of light-incident sides to which the plurality of optical modulator holders, the color-combining optical device attached and combining a light beam modulated by the plurality of optical modulators; and a cooling fluid relaying section that is disposed on a side in an extending direction of the circuit board out of the sides orthogonal to the plurality of light-incident sides and is intercommunicated with the respective fluid circulators being connected to the respective inflow ports or the respective outflow ports of the plurality of optical modulator holders and respectively inserted into the insertion hole of the circuit board to collectively relay the cooling fluid circulating in the respective fluid circulators.

6. The optical device according to claim 3, comprising:

the optical modulator including a plurality of optical modulator;

the optical modulator holder including a plurality of optical modulator holder in accordance with the plurality of optical modulators;

a color-combining optical device having a plurality of light-incident sides to which the plurality of optical modulator holders, the color-combining optical device attached and combining a light beam modulated by the plurality of optical modulators; and a cooling fluid relaying section that is disposed on a side in an extending direction of the circuit board out of the sides orthogonal to the plurality of light-incident sides and is intercommunicated with the respective fluid circulators being connected to the respective inflow ports or the respective outflow ports of the plurality of optical modulator holders and respectively inserted into the insertion hole of the circuit board to collectively relay the cooling fluid circulating in the respective fluid circulators.

7. The optical device according to claim 4, comprising:

the optical modulator including a plurality of optical modulator;

the optical modulator holder including a plurality of optical modulator holder in accordance with the plurality of optical modulators;

a color-combining optical device having a plurality of light-incident sides to which the plurality of optical modulator holders, the color-combining optical device attached and combining a light beam modulated by the plurality of optical modulators; and a cooling fluid relaying section that is disposed on a side in an extending direction of the circuit board out of the sides orthogonal to the plurality of light-incident sides and is intercommunicated with the respective fluid circulators being connected to the respective inflow ports or the respective outflow ports of the plurality of optical modulator holders and respectively inserted into the insertion hole of the circuit board to collectively relay the cooling fluid circulating in the respective fluid circulators.

8. A projector comprising: a light source device; an optical device including an optical modulator that modulates a light beam irradiated from a light source in accordance with image information to form an optical image, an optical modulator holder that has a cooling chamber in which the cooling fluid is sealed therein, the optical modulator holder holding the optical modulator so that heat can be transferred to the cooling fluid in the cooling chamber, and a plurality of fluid circulators intercommunicated and connected to the cooling chamber of the optical modulator holder to guide the cooling fluid to the outside of the cooling chamber and to re-introduce the cooling fluid into the cooling chamber; and a projection optical device projecting an optical image formed by the optical device in an enlarged manner, wherein the optical modulator includes: a driving board having a plurality of signal lines, a plurality of switching elements connected to the plurality of signal lines and a plurality of picture electrodes connected to the plurality of switching elements; an opposing board being opposed to the driving board and having common electrodes; a liquid crystal sealed between the driving board and the opposing board; and a circuit board electrically connected to the plurality of signal lines and the common electrodes and extending from between the driving board and the opposing board, the circuit board being provided with an insertion hole for a fluid circulator in which a cooling fluid is circulated to be inserted, the optical modulator holder has an inflow port for introducing the cooling fluid from the outside into the cooling chamber and/or an outflow port for discharging the cooling fluid in the cooling chamber to the outside, the inflow port and/or the outflow port being formed at a side corresponding to a position of the circuit board when the optical modulator is held; and the fluid circulator connected to the inflow port and/or the outflow port out of the plurality of fluid circulators is inserted into the insertion hole of the circuit board.

9. The projector according to claim 8, wherein the optical modulator holder includes a pair of frame members that respectively have an opening in accordance with an image formation area of the optical modulator and sandwich the optical modulator, and transmissive boards that are respectively disposed on sides opposite to opposing sides of the pair of frame members;

the cooling chambers are respectively formed in both of the pair of frame members by respectively closing the opposing sides and the sides opposite to the opposing sides of the opening of the pair of frame members with the optical modulator and the transmissive board; and one of the inflow port and the outflow port is formed respectively on first side of the pair of frame members corresponding to a position of the circuit board when the optical modulator is held, and the other one of the inflow port and the outflow port is formed respectively on an opposing second side of the first side.

10. The projector according to claim 8, wherein the optical modulator holder includes a pair of frame members that respectively have an opening in accordance with an image formation area of the optical modulator and sandwich the optical modulator, and transmissive boards that are respectively disposed on opposite side to opposing sides of the pair of frame members;

the cooling chambers are respectively formed in both of the pair of frame members by respectively closing the opposing sides and the sides opposite to the opposing sides of the opening of the pair of frame members with the optical modulator and the transmissive board;

the pair of frame members are provided with a communication hole intercommunicating the respective cooling chambers;

the inflow port is formed on a side corresponding to the position of the circuit board when the optical modulator is held in one frame member of the pair of frame members; and the outflow port is formed on a side corresponding to the position of the circuit board when the optical modulator is held in the other frame member of the pair of frame members.

11. The projector according to claim 8, comprising:

the optical modulator including a plurality of optical modulator;

the optical modulator holder including a plurality of optical modulator holder in accordance with the plurality of optical modulators;

a color-combining optical device having a plurality of light-incident sides to which the plurality of optical modulator holders, the color-combining optical device attached and combining a light beam modulated by the plurality of optical modulators; and a cooling fluid relaying section that is disposed on a side in an extending direction of the circuit board out of the sides orthogonal to the plurality of light-incident sides and is intercommunicated with the respective fluid circulators being connected to the respective inflow ports or the respective outflow ports of the plurality of optical modulator holders and respectively inserted into the insertion hole of the circuit board to collectively relay the cooling fluid circulating in the respective fluid circulators.

12. The projector according to claim 9, comprising:

the optical modulator including a plurality of optical modulator;

the optical modulator holder including a plurality of optical modulator holder in accordance with the plurality of optical modulators;

a color-combining optical device having a plurality of light-incident sides to which the plurality of optical modulator holders, the color-combining optical device attached and combining a light beam modulated by the plurality of optical modulators; and a cooling fluid relaying section that is disposed on a side in an extending direction of the circuit board out of the sides orthogonal to the plurality of light-incident sides and is intercommunicated with the respective fluid circulators being connected to the respective inflow ports or the respective outflow ports of the plurality of optical modulator holders and respectively inserted into the insertion hole of the circuit board to collectively relay the cooling fluid circulating in the respective fluid circulators.

13. The projector according to claim 10, comprising:

the optical modulator including a plurality of optical modulator;

the optical modulator holder including a plurality of optical modulator holder in accordance with the plurality of optical modulators;

a color-combining optical device having a plurality of light-incident sides to which the plurality of optical modulator holders, the color-combining optical device attached and combining a light beam modulated by the plurality of optical modulators; and a cooling fluid relaying section that is disposed on a side in an extending direction of the circuit board out of the sides orthogonal to the plurality of light-incident sides and is intercommunicated with the respective fluid circulators being connected to the respective inflow ports or the respective outflow ports of the plurality of optical modulator holders and respectively inserted into the insertion hole of the circuit board to collectively relay the cooling fluid circulating in the respective fluid circulators.

* * * * *